United States Patent [19]

Gopinath et al.

[11] Patent Number: 5,640,546
[45] Date of Patent: Jun. 17, 1997

[54] COMPOSITION OF SYSTEMS OF OBJECTS BY INTERLOCKING COORDINATION, PROJECTION, AND DISTRIBUTION

[75] Inventors: Bhaskarpillai Gopinath, Watchung; David Kurshan, Sea Bright, both of N.J.

[73] Assignee: Network Programs, Inc., Piscataway, N.J.

[21] Appl. No.: 390,705

[22] Filed: Feb. 17, 1995

Related U.S. Application Data

[63] Continuation of Ser. No. 21,096, Feb. 23, 1993, abandoned.

[51] Int. Cl.$^6$ .................................................. G06F 15/00
[52] U.S. Cl. .................................................... 395/551
[58] Field of Search .................................. 395/550, 551, 395/309, 683, 881

[56] References Cited

U.S. PATENT DOCUMENTS

| | | | |
|---|---|---|---|
| 4,315,315 | 2/1982 | Kossiakoff | 395/140 |
| 5,008,786 | 4/1991 | Thatte | 395/425 |
| 5,111,413 | 5/1992 | Lazansky et al. | 364/578 |
| 5,247,669 | 9/1993 | Abraham et al. | 395/600 |
| 5,301,301 | 4/1994 | Kodosky et al. | 395/500 |

OTHER PUBLICATIONS

Wilkes; "Complex and Composite Objects in CAP/CAM Databases"; Fifth Inter. Conf. on Data Engineering; Feb. 10, 1989; pp. 443–450.

Sim; "Design of a Persistent Programming Envir. in an OOL, Using Clustering and Composite Objects"; European Conf. on Design Auto.; Feb. 28, 1991; pp. 453–458.

Kramer; "Configuring Object-Based Distributed Programs in REX"; Softwave Engineering Journal; vol. 7, Iss. 2, Mar. 1992; pp. 139–149.

Levene; "The Hypernode Model and its Associative Query Language"; 5th Jerusalem Conference on Information Tech.; Oct. 25, 1990; pp. 520–530.

*Primary Examiner*—Thomas M. Heckler
*Attorney, Agent, or Firm*—John T. Peoples

[57] ABSTRACT

A methodology for developing scalable systems based on a technique for the composition of objects to form a larger, composite object using Interface Cycles, which are canonical programs, hardware, or abstractions which interlock protection, distribution, and coordination of data and control from the objects. The methodology thus allows the interconnected objects to form the new composite object which is subject to the same principles as the underlying objects and which may then used in any stage of the life cycle of a system. An Interface Cycle transitions through discrete phases only by agreement of all object interfaces connected by the Interface Cycle. Protection and data distribution of composite data collected from all the objects are effected under control of the Interface Cycle.

37 Claims, 12 Drawing Sheets

COMPOSITION OF SYSTEMS OF OBJECTS BY INTERLOCKING COORDINATION, PROJECTION, AND DISTRIBUTION

This is a continuation of application Ser. No. 08/021,096 filed Feb. 23, 1993, abandoned.

FIELD OF THE INVENTION

This invention relates generally to the implementation of software systems and, more specifically, to a methodology for composing numerous Individual systems into a composite system which exhibits the same operational properties and characteristics of the individual underlying systems.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

Implementation of complex systems involves the specification and development of components and the integration of these components to derive the complete or composite system.

To place in perspective the context of the present invention, the case of the composition of hardware elements is first elucidated. Hardware, either a printed circuit board or an integrated circuit, is developed using Computer Aided Design (CAD) tools. A design is built by placing reusable components on a schematic diagram. These components typically are stored in a library of standard components. The library representation of each component includes a pictorial representation which depicts the component's external connections, and an executable behavioral model of the component. Once a plurality of components have been placed on a schematic diagram the designer interconnects the components by introducing wires into the schematic. At this point, the designer can simulate the circuit being designed by using the behavioral specifications from the component library and the interconnection pattern of the overall schematic. In addition, the entire composite schematic may be associated with a pictorial image, and a list of its ports which are available to other, outside components may be devised; both the image and list are stored into the component library as an entirely new component. This new component may now be called upon to create another, generally more complex schematic. This ability to "compose" multiple objects into a single object makes it both possible and practical to reuse hardware designs.

It is informative to contemplate the properties of a wire which facilitate the interconnection of hardware components in a seamless, transparent fashion. A wire is both lossless and symmetric. Lossless means that signals are never discarded by the wire. Symmetric means that any signal applied at one end of the wire will appear at the other end of the wire, and that the wire is bi-directional, that is, the wire behaves the same no matter which end is used to transmit the signal (in more complex cases, the signal may be modeled as appearing at the other end of the wire after a time delay). These simple but elegant properties permit straightforward mathematical modeling of communications over wires. These very properties of a wire might be said to be the "missing link" in the design and implementation of software systems.

Recently, in the domain of software design, object-oriented programming has become widely accepted as a useful procedure to reuse software. In object-oriented software systems, objects do not communicate by wires, but rather by messages which the objects exchange with one another. Each object has a queue from which it retrieves and processes messages. The state of an object can be traced by its initial state and by the history of its message queue. Changing the order of arrival of messages obviously affects the state of the object, as well as the system into which the object is embedded. In a single processor system, changing the order of the arrival of messages from message originators outside the object is not a concern since, at any instant of time, there can only one active object (thread of computation). However, in a distributed system wherein there are multiple objects active concurrently, inconsistent behavior of the system may occur when the order of arrival of messages to an object is basically unknown and unpredictable to each object unless special precautions are taken to protect against this occurrence. Composition of a plurality of objects to create an composite object which is subject to the principles of object-oriented programming is not possible with the teachings of the prior art. The reason why such a composition in the conventional sense cannot be effected may be succinctly explained as follows. Multiple objects ("sub-objects"), which are to be composed into a single object ("super-object"), each have a their own queue. The composition of these sub-objects into the super-object must be such that the super-object has a single queue of its own. To accomplish this composition, it is necessary to impose some rules in order to properly sequence the message queues associated with the sub-objects. Unfortunately, these rules do not conform to the object model, and therefore places the super-object outside the domain of the object model itself. The end result is that object re-use, a prime motivator for object-oriented programming, is much more limited in software design as contrasted to hardware design.

As alluded to above, it is common today to design and implement systems from subsystems referred to here as Objects by providing for communications between Objects. The most common method is to simply allow one Object to send and receive messages to another. The simplicity of this concept hides its potential to create chaos in large systems. Various unspecified conditions such as how many messages can one Object send another, must an object always be ready to receive messages? Can one Object send another an unexpected message or a message that produces an error in the receiving Object? in recent past, these problems have led to a large number of protocols, rules for sending and receiving messages, in an attempt to solve them. However, this approach becomes very specific to the particular system that is constructed. Therefore, systems in general cannot be composed from canonical Objects. In synchronous hardware systems, on the other hand, the mathematical concept of a wire which distributes data and is controlled by a physical clock defining stable cycles, allows a canonical method to connect hardware elements. The symmetry and uniformity with which this abstraction is applied throughout the hardware development process is perhaps the single most important pad of the process.

The process of producing systems involves well known stages of modeling, specification, design, development, implementation, testing, and maintenance. It has become acutely evident in the recent past that this process critically depends on the model of concurrent computation that is used to model software and hardware objects. The process itself is acknowledged to be iterative with multiple concurrent iterations of stages by teams of developers. The success of object oriented technology has brought the problem of finding such a model to the forefront. In any serious system, a multiplicity of objects exists and these objects interact to implement the requirements of the system as a whole. Therefore, the coordinated behavior of collections of objects describes as well as implements the system. The importance of these problems has resulted in various international standard bodies who are actively seeking a model of objects that will serve as a basis for influencing the whole range of stages involved in software development. A method based on an abstraction which can be as uniformly applied as the wire in hardwire would alleviate some of the serious problems of developing systems. This abstraction has been, as yet, unavailable for general systems composed of hardware as well as software, or for software only systems. The closest form of prior art is VHDL (VHSIC Hardware Description Language), (a representative reference for VHDL is the textbook entitled VHDL, as authored by Douglas L. Perry and as published by McGraw-Hill, 1991), which is the latest in a family of languages which has proven very useful for hardware development. We briefly point out the function, use and importance of VHDL. We then discuss the innovative aspects of Interface Cycles.

VHDL

VHDL is an executable specification language for hardware. It was developed to address the problems of specification, acceptance, testing and reuse in the development, exchange and documentation of digital hardware throughout the life of the system. VHDL's model of concurrency is based on physical time, and composition of components is based on the abstraction of wires. The association of interfaces is through equating the end points of ideal wires. VHDL is the first concurrent language which has been standardized. The strong emphasis on concurrency and composition gives VHDL the ability to create a uniform description of hardware at multiple levels of abstraction, making VHDL powerful, and of use at all stages of the system life cycle. The following is a brief summary of the benefits of VHDL over other languages.

Descriptive Capability

VHDL can capture the behavior of any digital system at a number of descriptive levels at once. Therefore, it is possible to simulate designs that mix high level behavioral descriptions with low level detailed implementations.

Large Scale Design and Reuse

Specific constructs in VHDL such as packages, configurations declarations etc., serve sharing, experimentation, and design management on a large scale.

Design Methodology and Technology Support

VHDL is designed to support many different design methodologies. It is appropriate for use in library based tools and equally useful for ASIC based tools.

Technology and Process Independence

VHDL is not based on any information about technology or process assumptions. However, such information can be incorporated in a design using VHDL itself.

Design Exchange

VHDL being a standard can be used to exchange design data among independent organizations developing different pads of the same system. Because VHDL is executable, different groups may test their implementations against simulated high level subsystems provided by others.

Public Availability

VHDL was developed under a government contract and the government has strong interest in maintaining VHDL as a public standard. It is already an IEEE standard 1076, and several organizations including the Department of Defense, IBM, TI are committed to support it.

Government Support

The department of defense is currently requiring VHDL descriptions on all contracts that develop ASICs. Since VHDL can be used throughout the life cycle of a digital system, it is likely to become a major component of the procurement process for industry at large.

VHDL's ability to describe composition of large systems from component systems based on the hardware model was a key to its realizing the above list of benefits.

SUMMARY OF THE INVENTION

These shortcomings and other limitations and deficiencies of the prior art related especially to software systems are obviated in accordance with the present invention by the provision of the software equivalent to a wire referred to as a Interface Cycle, and a process for developing scalable systems based on a model for composition of objects to form larger objects using Interface Cycles. Various aspects of the present invention are as follows:

1. A process to compose new Objects from existing Objects, configured with interfaces each comprising an input, output, or both, by the construction and use of Interface Cycles that are canonical abstractions, programs or hardware which interlock protection, distribution and coordination of data and control from multiple Objects, thus allowing the Interconnected Objects to form a new Object which may then be used in any stage of the life cycle of the system.

An Interface Cycle transitions through discrete phases only by agreement of all interfaces connected by the Interface Cycle. Phase transitions and data distribution take place under the control of an Interface Cycle Manager. When all interfaces have released (requested a change of phase of) the Interface Cycle, the Interface Cycle Manager spontaneously transitions the Interface Cycle to the next phase. At this transition point, all data written to the Interface Cycle during the previous phase is made available for reading at the interfaces. All data written to the Interface Cycle is held by the Interface Cycle Manager until the next phase transition, when it is aggregated and distributed in total to the interfaces. Each Object having an interface, may process data concurrently and independently of the others, and may assume consistency of the data read at the Object interface, as long as it has not released the Interface Cycle at its own Object interface. Protection is enforced through input and output protection programs for each Object interface. The input protection program executes on every input from an Object interface, and the output protection executes on every output to an Object interface (as a pad of the phase transition). An Interface Cycle may be split, That is, a new Interface Cycle may be inserted into an existing one transparent to the Object interfaces of the original Interface Cycle. The new Interface Cycle is inserted immediately after the last Object interface has released the Interface Cycle and its input protection program has executed. Transition to the next phase is deferred until after phase transition of the inserted Interface Cycle.

Operational Description: Configure each component Object in the composite Object with N-type interfaces, L-type interfaces, or both, each interface comprising one input element and one output element. L-type Interfaces are used to connect to Interface Cycle Manager Interfaces, and N-type Interfaces are for connecting to an L-type Interface of any other object. All connections, therefore, comprise an N-type/L-type pair, referred to as a Basic Cycle. Configure the Objects with programs or hardware controlling the interfaces to coordinate input and output signals in Basic Cycles, each Basic Cycle to include a phase signal which serves to isolate the Object from operations: at the L-type interface during periods of time when the phase of the input is different from the phase of output at that L-type interface; and at the N-type interface during periods of time when the phase of the input is same as the phase of the output at that N-type interface. Compose component Objects with Interface Cycles to form larger components and interfaces by listing the component Objects, composite object interfaces, and the connections (Basic Cycles) between the component Object interfaces and the appropriate Interface Cycle Managers. Split Interface Cycles at the point in time when the input phase becomes different from output phase at all N-type interfaces of an Interface Cycle Manager. Distribute the data or signals from L-type interfaces through a network of Interface Cycle Managers by checking for patterns in data and allowing only those data that produce valid output of programs installed into these Managers to continue on to other L-type and N-type interfaces. Enhance Interface Cycles to define extended cycles by indicating start and end of extended cycles over multiple phase transitions. Enhancing Interface Cycles by providing an A-type interface, which, when connected to another A-type interface, negotiates with that A-type interface to assume the characteristics of either an L-type or N-type interface as appropriate while the ether A-type interface assumes the characteristics of the opposite type interface.

2. A method of programming based on the coordination between Objects through the direct control of interlocked coordination, protection and distribution of data among groups of Objects through uniformly specified interfaces.

In this method of programming, there is a program referred to as a description associated with each Object. The description has two different forms, a Composite Description for composite Objects (an Object which was composed from component Objects), and an Atomic Description for atomic Objects (an Object which was not composed from component Objects), the composite description comprising a list of input interfaces, a list of output interfaces, a list of component Objects, a list of equivalances of names of component interfaces to names of composite Object interfaces, and a list of connections between component interfaces as discussed above; and the atomic description comprising a list of input interfaces, a list of output interfaces, a list of connections Interface Cycle Managers, and a script of program statements which describes the behavior of the Object in terms of both local variables and the state of its interfaces. This script may contain event handlers which are executed whenever a particular port changes phase, or it may poll each interface to check for state changes. It may also send and retrieve data from any of its interfaces, and/or request a phase change at any interface.

Operational Description: Specify atomic descriptions by listing its exposed interface cycles (inputs and outputs), component Objects and connections. Include a script which consists of actions to be performed when any of the interface cycles progress, and actions to be performed when split interface cycles progress. Connect these scripts to form larger scripts by listing exposed interfaces, equivalances, connections and sub-descriptions (component Objects). Use existing descriptions to create new components in a manner analogous to the creation of new data types from existing data types.

3. Specific implementations of this process to interlock protection, distribution and coordination in Interface Cycles.

I. Basic Multi-point Cycle, wherein a common view of shared, synchronized data is provided to each of its interfaces.

II. Static Interface Cycle, wherein all features of the Basic Multi-point Cycle are combined with coordinated notification of exceptions generated by Objects connected to its interfaces, and generalized coordinated notification of protection violations both for input from the interfaces, and output to the interfaces.

III. Dynamic Interface Cycle, wherein all features of the Static Multi-point Cycle are combined with the ability to dynamically split Interface Cycles transparent to its interfaces. This allows for "hot plug in" of Objects (i.e. the ability to dynamically reconfigure connections between object interfaces, and to replace object descriptions while the system is active).

IV. Extended Interface Cycle, wherein all features of the Dynamic Interface Cycle are combined with the ability to define extended cycles by indicating start and end of extended cycles over multiple phase transitions of the Dynamic interface Cycle.

V. A Interface Cycle Controller, which, when given a request containing a description of an Object, instantiates all the instances of the component Objects, instantiates all connections between component objects via Interface Cycles, maps interface names according to the Equivalences declared in the Object description, and activates the Object system it has created, after which it returns an acknowledgment to the requester.

Operational Description: Construction in hardware or software canonical managers called the basic, static, dynamic, extended and self adjusting and signaling interface cycle mangers by configuring with programs as described by pseudo cede in this application.

The organization and operation of this invention will be understood from a consideration of the detailed description of the illustrative embodiment, which follows, when taken in conjunction with the accompanying drawing.

DETAILED DESCRIPTION

Overview

Figure 1:
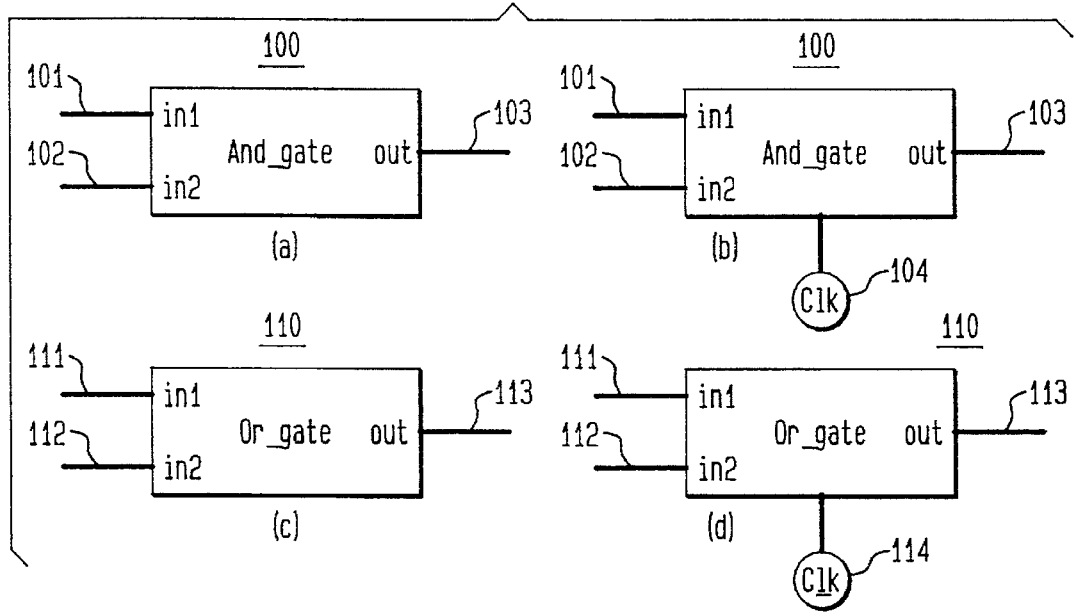
FIGS. 1 and 2 illustrate block descriptions of hardware components.

VHDL uses real-time to describe timing and sequencing among components. For general systems where hardware and software are used, this physical time cannot be used, because there are no real-time guarantees available. Interface Cycles provide for self synchronizing interfaces without reference to real-time. Interface Cycles, at the same time preserve the symmetry and lossless properties of wires on which VHDL is based. In addition, Interface Cycles provides a method to model and implement dynamic hardware and software systems, by finding a way to split cycles dynamically, and thus describe changes in configuration of hardware and software systems. This overcomes the limitation of VHDL to describe dynamically changing wiring patterns while subsystems are active. A basic difference between VHDL and this invention is that Interface Cycles provide a uniform methodology for specifying as well as implementing both hardware and software systems rather than just a language.

Prior art in software has focused on providing software environments with a rich set of tools that increase the productivity of system developers. This produces an ever increasing family of useful tools. When scaled, the environment poses problems which cannot be solved simply by a new tool. Our approach is to find a method based on reliable abstractions that change the very nature of how Objects are composed to produce Systems. It is analogous to asking, before bricks and mortar were invented, whether there exists something like bricks and mortar to build large structures. When individually crafted stones where the only ways to build structures, one was tempted to simply improve the set of tools for crafting stones, We ask: what is the smallest set of functions that can be used methodically and uniformly to provide a precise model for elements of Objects that together form larger systems? The key to the invention is the discovery that there only three necessary and sufficient functions which, when interlocked together, can provide these basic elements. These turn out to be Protection, Distribution, and Coordination. We describe these concepts briefly below.

Protection

By protection, we mean the function of isolating objects from one another such that inadvertent or purposeful corruption of data they are distributing is unlikely. Providing protection internal to the objects is insufficient to achieve this. Objects process data from other Objects and expect certain properties of this input data, in order to function correctly. It is, of course, common today to provide memory protection in modern operating systems, usually supported directly by the hardware. This protection is simple but effective to provide isolation between programs, but does not provide controlled protection. Controlled protection is needed in most systems, because systems cannot be mapped to a memory model which is neatly compartmentalized and static. Most systems need dynamic protection definable in logical terms and specifiable at events that are not directly related to physical hardware level events. This is critical for several reasons, including the need to align the check for protection at logical steps where faults may be handled in a coordinated way. For example, if there is a need to change the behavior of an object, this change must not corrupt either the behavior of, or interactions with other objects with which it is communicates. When behaviors are changed while objects are functioning, the new behaviors are usually implemented by programs that have not been fully tested. Therefore, they can still contain errors in their implementation. This could result in messages that other objects may not process correctly or receiving messages that it may not yet be able to process correctly, because such facilities have not yet been provided in the object. Therefore, the provision of protection itseft requires that Objects coordinate and communicate with one another.

Distribution

The distribution of data is the primary method of communication among Objects. However, data that is distributed may represent a request to execute functions, or a request to provide services to other subsystems. Therefore, distribution of data also involves distribution of control. However, improper sequencing of data to and from Objects can easily cause Objects to behave in unpredictable ways. In a simple instance, when an Object is coordinating with only one other subsystem, it usually knows the others identity and coordinates directly with it, using the knowledge that there is only one other Object involved in the interaction. Even in this simple instance, the sequencing of messages may play a critical role in the interpretation of events. So, if sequencing constraints are violated, then the distribution of data becomes unreliable. There are, of course, ever increasing instances where there are multiple other Objects Involved in controlling a single Object, like the control of a conference call. In such systems, the Objects may only be aware of a service that they use and not be aware of the identities of every other Object involved. Therefore, distribution based on the identity of sender and receiver must be replaced by one based on the function the data serves independent of the source or receiver.

Coordination

The function of communication is often understood to mean also coordination. However, even in a two party case, the ability to communicate may not provide the ability to coordinate. If, for example, the communication path is unidirectional, communication does not provide the ability for the two parties to coordinate. Even if there is bi-directional communication, it is necessary to provide coordination to make sense out of what is communicated. This is analogous to the need for synchronization at the lowest hardware level of a directional communications link. Coordination is imposing the maintenance of a set of constraints on the joint histories of Objects. While real-time history is not essential for the logic of programs, we must logically specify what the corresponding points in history are, when multiple histories have a common constraint. Such shared histories cannot be externally defined, in the sense that only the programs using the joint history know or care about corresponding points in their respective histories. Therefore, these programs must have full ability to define coordination points.

Interlock of Protection, Coordination and Distribution

Most systems today already provide each of the component functions. However, to find a suitable element that serves to compose Objects, providing each separately becomes infeasible. In order to implement Protection, one needs Distribution and Coordination; in order to implement Coordination, one needs Protection and Distribution; in order to implement Distribution, one needs Protection and Distribution. A method to interlock at the elemental level, it turns out, is sufficient to achieve full generality in composing systems from component Objects. The ability to coordinate in a sequential program arises from the explicit sequencing of instructions. In a coordination between several entities, it turns out that there must be a collaborative cycle in order to maintain the symmetry of the interaction from the outside. In complex systems, there is a further need to collaboratively sequence events at several entities. To accomplish this, linking objects via a two point link is replaced here with a multi-point connection. Although multi-point communication can be achieved by several two party connections, the number of connections grows to be much larger than one in which multiple objects connect via a specific Object. When there is more than one object in the communication event, the prior art does not provide a canonical abstraction for this Object that is symmetric and lossless like a wire. Interface Cycles does provide the necessary abstraction.

The basis for the invention is the realization that a process for developing scalable systems based on a model for composition of objects to form larger objects, with the necessary frugality of functions, can have the breadth and power to serve all stages of software development. Such methods are common in the hardware development process because of the use of a physical wire to connect components. However, Objects and hardware objects that do not share physical time based clocks do not have the analog of a wire clocked by a real time clock to model connections. The Interface Cycle invention provides a method for medeling concurrent software or hardware objects and composing them to form larger objects in such a way that all the stages of system development can be uniformly supposed by this composition process. The shared history that objects use in the methods described here, is the history of uniformly defined interfaces. This provides for the uniform property that all Objects sharing an interface see the same joint history coordinated by their own logic. Each object decides for itself when it is ready to advance the history of an object, and history does not progress until every object dependent on the interface agrees.

Details

In the following, we describe in detail how to construct the basic services needed to reduce this invention to practice. First, for the purpose of explaining the operations and pseudo cede we use an informal notation to help those skilled in the art. The use of a particular programming language would detract from the teaching of the essence of the methods while not adding significantly to the precision. The notation here is nonetheless analogous to the notations in most common programming languages. The application of this invention need not be in any one particular language or programming environment. This invention could be implemented in hardware as sell as software. It is more important to apply the process uniformly than to implement it in one particular domain. After introducing the notation, we describe how to implement certain interfaces and services. The basic services that are needed are: Basic Directional Data Transfer, Atomic Transfer Cycle, Atomic Attempt Cycle, and Atomic Interrupt Cycle. Using these services we show how to construct a set of managers for: Basic Directional Transfer, Basic Cycle, Basic Multi-point Cycle, Static Interface Cycle, and the Dynamic Interface Cycle.

Working Notation

Data Structures

Data structures are described as nested sets. An enumerated set is described by the list of its elements, for example: $\{a,b,c\}$ is the set consisting of a, b and c. A data structure x represented by $x.\{a,b,c\}$ can have values a, b or c. Power sets such as a vector of bits are denoted using ^. For example, $\{0,1\}\text{^}L$ denotes a vector of L bits. When a data structure has several components we use a comma to separate the elements, for example: [x,y] has two components. A nested structure is denoted using the nesting of [ ] and { }. For example: $[x.\{a,b,c\}, y.\{d,e\}]$ consists of two components x and y where x can take the values a, b or c and y can have values d or e. An index used to denote arrays of structures is enclosed in [ ]; for example: $x.[1,2,\ldots,N].\{a,b,c\}$ denotes an array of variables $x.[j]$ for $j=1,2,\ldots,N$ each of which may take on the values a, b or c. At any level of nesting, [{ }] is { } and {[ ]} is same as [ ]. So, [{a, b, c}] is the same as {a,b,c}. However. {[a, b, c]} is the same as [a, b, c]. The modification of data structures by events are described by indicating the components that change. All other components are assumed to have the previous value, for example: sot $x.[3,4]=a$ only changes the values of x.3 and x.4 to a. Substitution of a label with the value of another is indicated by < >; for example: $x.<y>$ denotes x.z if $y=z$. A * at a place in a data structure denotes all possible substitutions; for example: $x.*.a$ denotes all elements of the array x that have the value a. A % at a place in a data structure indicates that % can be substituted with any one element that can occupy that place. So $x.\%.a$ indicates any one element of the set $x.*.a$. Specific instances of a data structure that may take on several values are represented by denoting the values of components using =, or by showing the values in place. For example, the data structure $x.[y.\{a,b,c\}, z.\{d,e\}]$ could have value $x.[y=a, z=d]$, or equivalently, $x.[\#a, \#d]$ or $x.\#[a,d]$. The notation for assignment in such data structures is set $x.y.a$ which is equivalent to set $x.y=a$ if $x.y$ has only one value or extension. In this example $x.y$ can have only one of the values a, b or c. However, the variable x itself can have the value [y.a, z.d] so $x=y.a$ would be meaningless because no mention of the z component has been made. On the other hand, set $x.y.a$ would be still meaningful because $x.y.a$ fully describes the component that is set.

The data structures are treated simply as a set of names; and they can denote ordinary data as in a computer program or names of programs themselves, or act as labels of steps in a program.

Pseudo Code

We will use several constructs that are uses in standard programming languages in the pseudo cede. Some examples of notation are:

End of statements are denoted by ;.

When nested control structures are used nesting is explicitly Indicated. For example: begin, end; if then else, endif; etc. When these are placed on a single line by themselves; may be omitted where unnecessary.

Statements that have labels show labels at the beginning of the statement followed by: and goto is used with the label denoting the step to which program branches.

Standard operator symbols such as arithmetic operators are used without explanation. For example:

AND, OR, NOT, +, −, *, /

Local variables are sometimes declared in place and their use indicates their type.

New types of data structures are created from already defined types using the above notation for sets. We assume some primitive types of data listed below:

BOOLEAN.{TRUE, FALSE}
INTEGER.{0,1,..*}
BIT.{0,1}
LABEL.{Statement Labels}
Notation for indicating new type is as follows:

Type name:=definition of new type in terms of old types example:

Type: Input:=[in1, in2].{BOOLEAN}

If A is of type Input, then the values of A are a.[in1, in2].{0,1}.

Data structures can also be defined with in place typing as in:

Inputs: a.[in1, in2].{BOOLEAN};

Names of Types are either all capitals or start with a capital letter. All other variable instances start with a lower case letter.

Assignment is replaced by the construct set LHS=RHS, which means after the execution of the statement, value of the left hand side of the equation is replaced by value of the right hand side.

set x=y;

Protection, Distribution, and Coordination

Invariants of Protection, Distribution, and Coordination which must be maintained are contained between the keywords PDC and end PDC
 Services
 Scripts
Objects, Descriptions and Composition
Atomic Objects and Descriptions An Object has multiple interfaces and it coordinates the services it provides on these interfaces. An interface specifies a set of data structures, services specify what relations are maintained by the Object among the interfaces. The interfaces are assumed local to the object. An Object may be restricted from modifying some of the components of its interface. Simple examples of Objects are logic gates, for example, an "and" gate. It has three interfaces: two inputs and one output. The function of the gate does not change the values of the inputs, but uses the values to produce the output. How this gate functions can be described simply as follows:

---

Description: And_gate:=
 Input:[in1, in2].{BOOLEAN};
 Output:out.{BOOLEAN};
 Script:
  begin
   Initials: set out = FALSE;
   set out = in1 AND in2;
  endScript;
 PDC:
  Input accessed but not modified, output modified.
  time the Input changes the Output is changed.
 endPDC;
endDescription

---

Like the definition of a type, the description is not attached to any particular instance of a gate. Particular gates are objects. A particular gate is shown by:

Object: a.And_gate;

This notation is analogous to the notation for types we saw earlier for defining instances of types. There can be many instances of objects that are of the same description. The description And_gate describes how an "and" gate behaves: the behavior of its inputs and outputs. Usually, as illustrated by And_gate 100 in FIG. 1(a), it is interpreted to mean that every time an And_gate gets inputs (reference numerals 101 and 102) it produces an output (reference numeral 103) which is the "and" of its inputs. Intrinsic to this interpretation is that there is a cycle in which the inputs are registered and then the outputs are produced. In hardware, we usually ignore a clock, because it is always assumed (FIG. 1b). As long as there is a clock that determines this cycle, the meaning is clear. These descriptions are atomic in the sense that they do not refer to any other descriptions themselves. Furthermore, the interpretation of the script implicitly relies on a sequential model of computation. The computation proceeds step by step in cycles defined by some atomic step. This is much like hardware clocks determining the validity of the relation between inputs and outputs of a clocked gate. Relative to this Atomic Cycle (AC), an Atomic Description specifies at every step, the names of data structures that can be changed only as a direct result of the operation associated with the step. These are not effected at that step by any other operations that may be simultaneous. The changes in these are also atomic with respect to AC in the sense that the set of names that are changed are all changed to the new values at the end of the step and the names that are not directly effected by the operation do not change their value at the end of the operation. The inputs of this gate cannot be changed by the statements of this description.

The above example mirrored hardware, Descriptions of software objects can be made using similar notation, A very common interface, for example, is the function call interface. Functions execute a sequence of operations, after the completion of which the names referred to in the argument list may change values, after which the function returns to the same point in the original sequence of operations from where the call to the function was made. To clearly define exactly what a function does, we have to be careful about which arguments change, and when they change. We will define functions in a way that clarifies these. We indicate in our notation which arguments are changed by the branching to the functions. All function calls are shown as:

set x=f(y);

PDC:
 Access value of y before execution of step, if needed modify x at the end of step.;
endPDC This denotes precisely that the data structure x can be modified by the function while the previous value of data structure y is unmodified by the function itself, though operations described in the function may refer to the values of y. A function's interface is also a set of inputs and a set of outputs. This now makes the function look more like the above example. We can have similar descriptions for functions:

```
Description: And:=
    Input:[in1, in2].{BOOLEAN};
    Output:out.{BOOLEAN};
    Service:
        set out = And(in1, in2);
    Script:
    begin
        Initials: set out = FALSE;
        set out = in1 AND in2;
    PDC:
        Input accessed but not modified, output modified. Each
        time the service is called, output is modified.
    endPDC;
endDescription
```

In this example, the service offered the computation of And of two inputs. This service is obtained by another script that calls the function. The line Service: describes how such a call is made. No such convention is needed for hardware. Hardware is always specified by the connection between the components. The use of functions seems to differ from the way we use gates in hardware. With closer examination, the differences turn out to be less significant. What really happens in a function call is a substitution of the arguments with the specified values at the time of the call. Suppose an instance of use of the function is:

set a=And(b, c);

If the variables a, b, and c have been declared Boolean, a would be set to the logical AND of b and c. This occurs because in the above atomic step, the local variables to program a, b, and c have replaced the arguments in1, in2 and out respectively of the description of the function. This replacement is analogous to "connecting" the inputs in1, in2, and output out of the "component" function, which is an instance of the description And, to the outputs a, b and the input c respectively of the calling program; then executing the function or starting the "clock" of the function and severing these connections when the function has completed its sequence of steps. So the service is analogous to a dynamic connection and disconnection service.

Atomic descriptions or sequential programs cannot be interpreted without some guarantees of which variables can be changed and which cannot. This is why the specification of inputs and outputs is important. It is only on local variables that programs can directly operate. When programs are composed together, at least some of these variables have to be connected to others. As long as these connections only connect compatible inputs and outputs, the composed program has some sequential interpretation, as long as the sequencing can be implicitly defined by the connection pattern of inputs and outputs. No input should be "fed" to a component unless the corresponding output to which it was connected is ready. Proper implementation of the object usually creates the illusion that the output one program is the input of the other, even though these two may not have the same value at each instant of real-time.

Composite Objects and Descriptions

The notion of cycles to define programs that are not concurrent is derived from the oldest definitions of algorithms. An algorithm usually is a series of steps, where one step is a cycle of computation. Specifying and implementing general interfaces requires the specification and implementation of a connected set of concurrent objects. No such concept exists today for concurrent objects. We describe below the problem in more detail.

Let us define another simple gate, the Or_gate 110, analogous to And_gate 100, as shown in FIGS. 1(c) and 1(d). Accordingly, as shown in FIG. 1(c), every time Or_gate 110 gets inputs (reference numerals 111 and 112) it produces an output (reference numeral 113) which is the "or" of its inputs. Clock 114, shown in FIG. 1(d), is also intrinsic to this interpretation. Thus, the description is:

```
Description: Or_gate:=
    Input:[in1, in2].{BOOLEAN};
    Output:out.{BOOLEAN};
    Script:
    begin
        Initials: set out = TRUE;
        set out = in1 OR in2;
    end
    PDC:
        Input accessed but not modified, output modified. Each
        time the Input changes the Output is changed.
    endPDC;
endDescription
```

Figure 2:
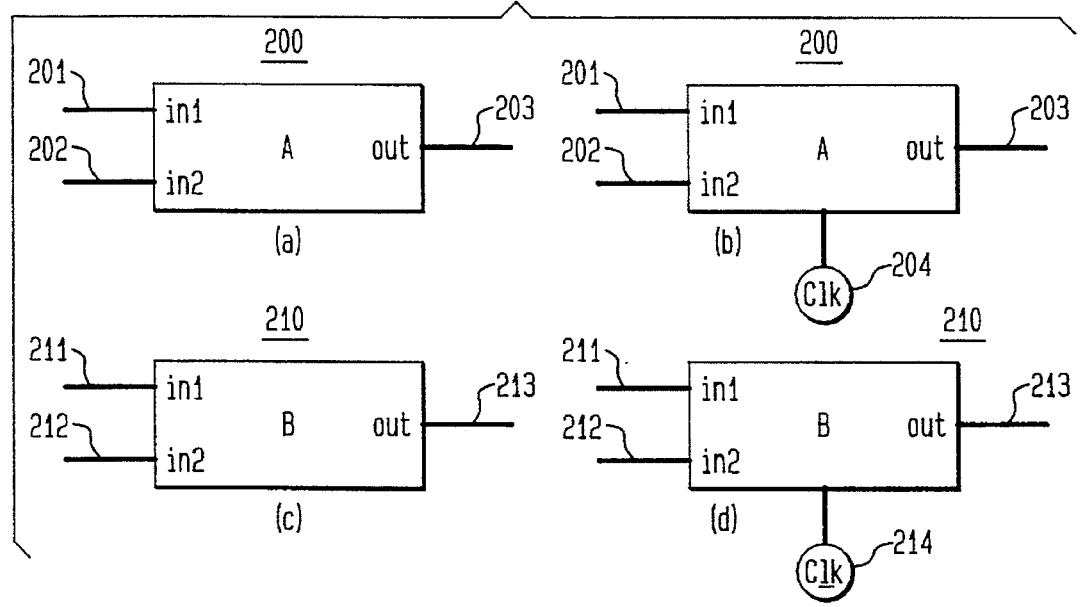
Figure 3:
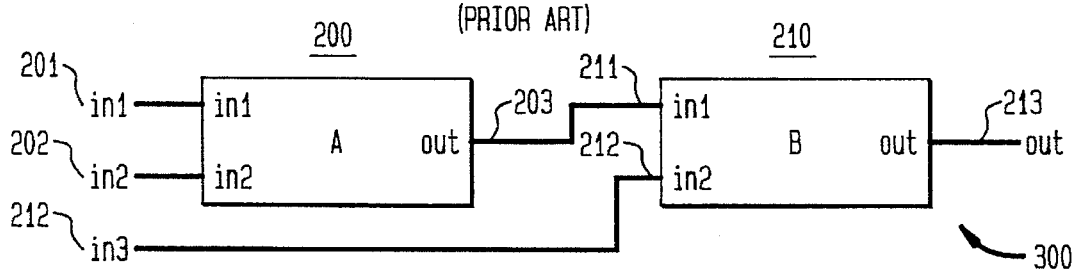
FIGS. 3 through 7 are used to illustrate some of the interpretation difficulties which arise when composing objects into larger ones.

Carrying the hardware analogy, we can form networks of these components to form more complex Boolean circuits by connecting these. Suppose we have two gates, e.g., the And_gate of FIG. 1(a) and the Or_gate of FIG. 1(c), which are shown generically by A block 200 in FIG. 2(a) and B block 210 in FIG. 2(c), respectively. (The intrinsic clock inherent in the representation of FIGS. 2(a) and 2(c) is shown by FIGS. 2(b) and 2(d), respectively—these latter two figures are the counterparts to FIGS. 1(b) and 1(d)):

Object:
      a.And_gate;
      b.Or_gate;
   endobject;

A new object can be created using the wiring diagram of FIG. 3, wherein composite object 300 has been formed by interconnecting objects 200 and 210 of FIG. 2 in the manner shown, that is, the inputs 201 and 202 to A block 200 yield an "and" output 203, and the inputs 211 (here same as output 203) and 212 serve as inputs to B block 210 to produce the "or" output 213. This same diagram can represent a new object which is described by the connection list:

```
Object: C;
    Inputs:[in1, in2, in3].BOOLEAN;
    Outputs:out.BOOLEAN;
    Components: a.And_gate, b.Or_gate;
    Equivalences:
        C.in1 = a.in1;
        C.in2 = a.in2;
        C.in3 = b.in2;
        C.out = b.out;
    endEquivalences;
    Connections:
        a.out = b.in1;
    endConnections;
endObject;
```

Typically all these connections can be deduced from a simple diagram (FIG. 3). However, the definition of a new object from other objects is not always interpretable from such a network. The definition of the composite Object must also specify what inputs and outputs are in fact exposed. That is where an explicit list of inputs and Outputs and how they relate to the components own inputs and outputs remove the ambiguity. This net-list or connection list produced a new object C. What is its description? it seems natural to take the descriptions of And_gate and Or_gate and put them together like C was put together from A and B.

The new description would be:

```
Description: Composit:=
    Inputs:[in1, in2, in3].BOOLEAN;
    Outputs:out.BOOLEAN;
    Components: And_gate, Or_gate;
    Equivalences:
        Composit.in1 = And_gate.in1;
        Composit.in2 = And_gate.in2;
        Composit.in3 = Or_gate.in2;
        Composit.out = Or_gate.out;
    endEquivalences;
    Connections:
        And_gate.out = Or_gate.in1;
    endConnections;
endDescription
```

Figure 4:
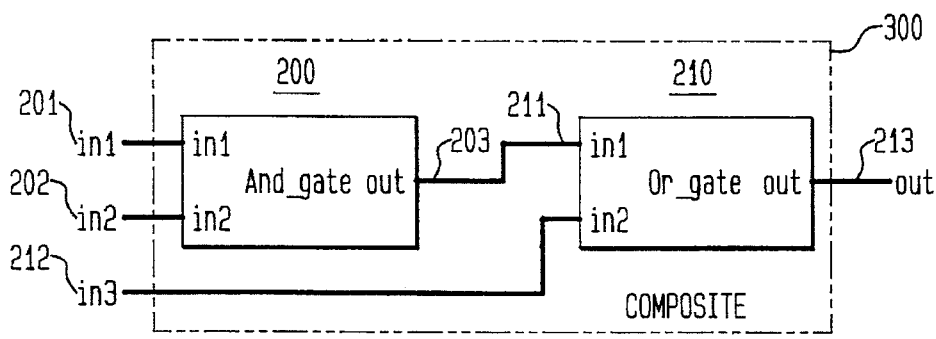
Figure 5:
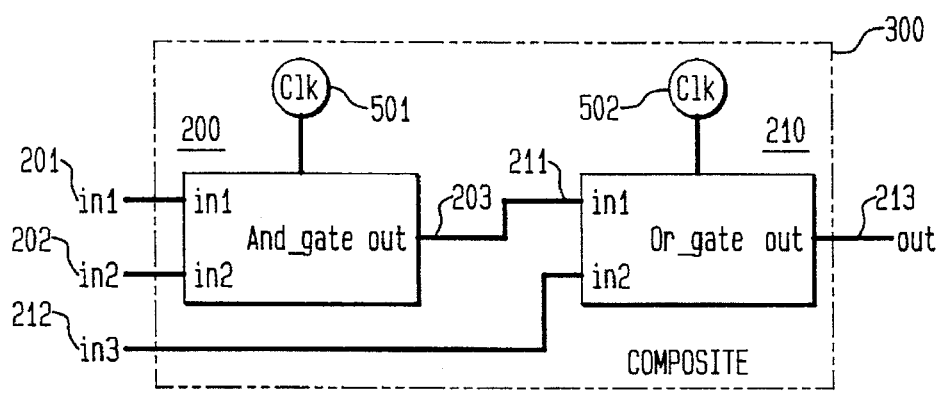
Figure 6:
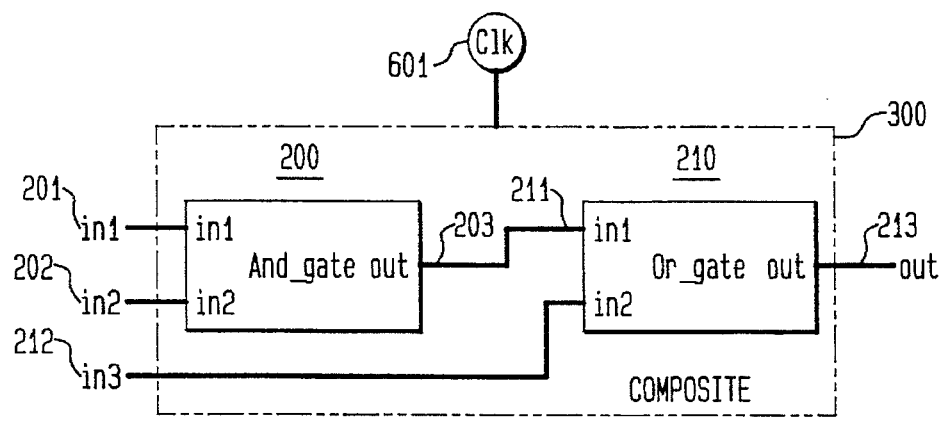
Figure 7:
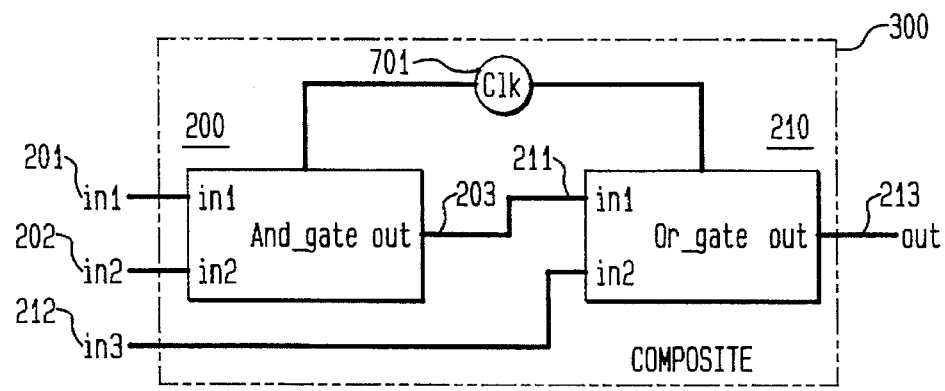

How do we interpret this description? For example, FIG. 4 explicitly shows And_gate 200 and Or_gate 210 connected in the manner depicted generically by composite object 300 of FIG. 3. If the individual descriptions are interpreted based on a clock for each of the descriptions, then we have FIG. 5, wherein composite object 300 is shown to have clock 501 serving And_gate 200 and a separate clock 502 serving Or_gate 210. However, if the description is always meant as docked by a single clock we have FIG. 6, wherein composite object 300 is shown as being served by single clock 601. Then again, whether this clock is inside or outside the object (exposed or not) may determine whether components can connect to it if we have a single clock description, This is shown in FIG. 7, wherein clock 701 is shown as being inside composite object 300, that is, clock 701 is not exposed to other external objects. It is easy to see that, depending on which scenario we assume, the interpretation of the description is different. In the case of two clocks (FIG. 5), for example, the rate at which the And_gate would produces results may be different from the rate at which the Or_gate could produce results. This cannot happen if the two shared a single clock (FIG. 6 or 7). From these examples, it is obvious that the connection list is insufficient to uniquely specify the description of the composite Object.

The exposed single clock case is what is usually assumed implicitly. In this case, it is easy to see that the composite description is interpreted atomically. Once the number of components becomes large, however, a single clock specifying or implementing the whole system becomes an inadequate model for systems. Different parts of the system must be clocked separately, requiring the description to include information about the sequencing of events in the system. The amount of potential ambiguity which arises and, hence, the complexity of the problem, increases dramatically when the number of objects sharing a connection is more than two (i.e. the connection becomes a multi-cast net instead of point to point). Unfortunately, this is exactly the situation which often arises in large systems because of the need to share data among multiple concurrent processes for reasons of performance and/or reliability.

Figure 8:
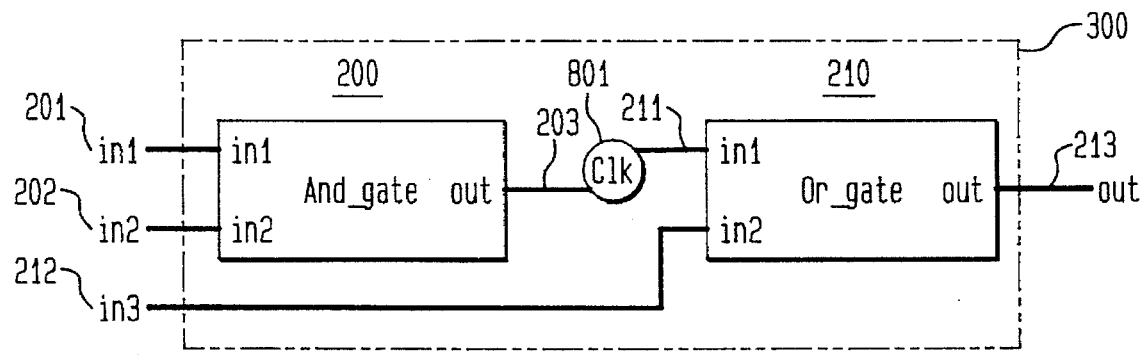
FIG. 8 illustrates object composition wherein the coordination between components is managed by the interfaces between components rather than managed by the components themselves.

Interface cycles, on the other hand define clocks on the wires connecting the components rather than on the components themselves. Thus, as shown in FIG. 8, clock 801 is inserted in series with output 203 of gate 200 and input 211 of gate 210. In this case, since component objects control the clocks at the interfaces themselves, the connection list does, in fact, specify a unique description. In other words, no additional sequencing information is required in the description to resolve ambiguity.

Interface Cycle Process Elements
Atomic Transfer Cycle

A very common interface, the assignment interface can Implement an Atomic Transfer. Some sample services using this interface are:

Service:
    set out=in;
    set out=function(in);
Usage:
    set b.out=a.in;
    set b.out=f(in);
PDC:
    All arguments on the right hand side are not modifiable, arguments on the left side can be modified.
endPDC Here soon after the execution of the statement, value of b.out becomes the previous value of a.in. This cycle is atomic in the sense that execution of the step guarantees a property of the previous value of a.in and the new value of b.out. There are no intermediate values of a.in and b.out which are relevant to service. This transfer can be used to implement equality among local variables in programs or among local variables of multiple programs by only allowing one program to be active at a time. Then the update appears instantaneous to the description because of the atomicity.

Atomic Attempt Cycle

When there are a multiplicity of programs that are simultaneously active, it is not always possible to implement an Atomic Transfer Cycle. However, an Atomic Attempt Cycle to transfer can always be implemented. A function call interface can provide feedback even if the update is not always possible, as in:

Service:
    try out=in else goto {LABEL};
    try out=function(in) else goto {LABEL};
Usage:
    get: try out=in else goto get;
    get: try out=f(in) else goto get;
Remark:
    Above statement branches to the statement labeled LABEL if it fails to set out=in, else it continues to the next statement. If it branches, a variable named by the LABEL holds the status of the attempt.
endRemark;
    look: if look=ABORT then goto elsewhere;
    get: try out=in else goto look;
Remark:
    In this example if status of the attempt to execute is any unsuccessful condition other than ABORT, then the statement labeled by get is attempted again. If the try statement is successful in making the assignment, the statement following the one labeled get: is executed next.
endRemark Atomic Interrupt Cycle During the course of a sequence of statements programs may be interrupted. It is possible to interrupt programs at every step, because the interrupt is actually implemented through hardware. Since the method of programming we follow here is event driven, we need such a service similar to interrupt.

Services: set initial=install(at, label), set final=destall(at, label);

At the occurrence of an interrupt event, the program atomically branches to a named step in the program that usually corresponds to a handler for the event. This connection between the step and the interrupt is made with install and removed with destall. The value of initial and final usually is the status of the event at install and destall time respectively. There is no need to handle the interrupt in a given amount of real-time. Instead, priorities may be enforced. Even without priorities the assumption made is that interrupts will eventually be handled.

Basic Directional Transfer

Figure 9:
FIG. 9 the fundamental communications capability, providing data distribution, but neither coordination nor protection of the data.

We assume that a distribution capability is provided by the environment, either as a wire, as memory space accessible to the Objects sharing it, or as a shared communications channel. It provides distribution, but neither protection, nor coordination. Such a distribution capability is illustrated in FIG. 9 by wire 901.

Figure 10:
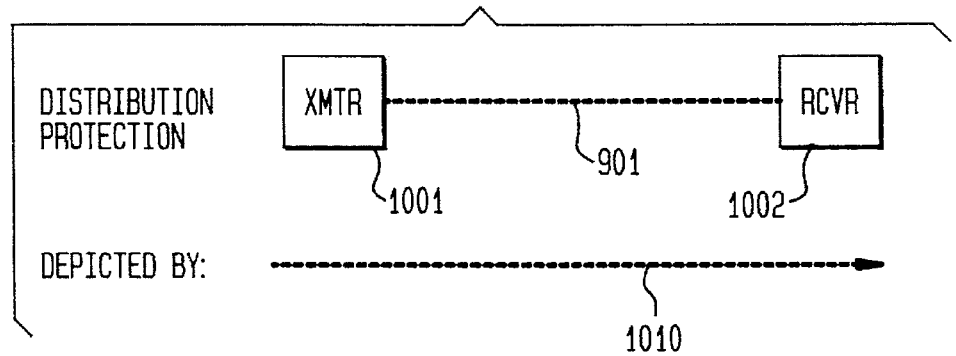
FIG. 10 illustrates Basic Directional Transfer, providing data distribution and protection, but no coordination.

A Basic Directional Transfer (BDT) is modeled as a wire 901 interconnecting transmitter 1001 and receiver 1002 as shown in FIG. 10(a). The combination of wire 901, transmitter 1001, and receiver 1002 is represented by the Basic Directional Transfer 1010 of FIG. 10(b). It provides distribution and protection, no coordination. Protection arises from the fact that one end of a BDT may only insert data, while the other may only extract it, thus limiting the capabilities which may be exercised at either end. Systems based on prior art use BDTs plus physical time and application specific complex protocols to provide coordination.

The basic protection provided is through transmitters and receivers that allow information to proceed, in any one cycle, only in direction on the wire at a time. However when we cannot schedule events using a hard real-time clock, we need to coordinate by agreement between the Objects themselves. Given two Objects, then this requires at least a full cycle of interaction before an agreement can be reached. This situation gets worse if there are more than two entities coordinating on the same "wire". Even in clocked hardware systems, wires have to be replaced by buses to solve the multi-point connection problem. But, unfortunately, buses do not preserve the symmetric, lossless properties of wires which allow us to define precisely how an interconnection of Objects compose to form a new Object.

Basic Directional Transfer allows the transfer of data from one object to another or transfer of an object from one data to another. The end result is the association between an input interface with an output interface without any feed back. An example is ordinary but ideal mail: an item can be sent from one location to another and it eventually reaches the addressee in its original form. There are no specific guarantees about arrival time. BDT similarly transfers the data most of the time to the addressee. However, we do not insist that the BDT not lose any of the data. Data can be lost. However, there does not exist any data, such that if it is sent via a BDT often enough, it will not be eventually delivered. Thus a BDT can deliver any data correctly if the transfer is tried enough times. However, an item that is lost is assumed to never reappear and be delivered. (This can relaxed but the procedure to handle this is not essential to this invention). BDT objects consists of two Interfaces in and Out. BDT Transfers the value of its In to the value of its Out. So, after every change in the value of In the new value is eventually reflected in Out. However a BDT may do this repeatedly. Every time it samples the value of In it may transfer that value to Out.

Many modern operating systems and networks offer services from which this kind of object can be constructed. Unreliable packet Transfer is an example. By re-transmitting packets sufficiently many times a packet eventually reaches its destination. Most operating systems today have a mechanism to transfer data from one process to another, such as message passing primitives of various flavors. All of them usually include one which is sufficient to implement BDT. A sample usage is as:
set b.out=send(a.in);

This call looks like a function call, however, it is usually implemented as a system call needing operating system intervention, and it is not guaranteed that a.in will actually assume the value of b.out at the execution of this statement. The ordinary function call provides instantaneous feed back, while BDT does not provide any feedback of its eventual success.

Figure 11:
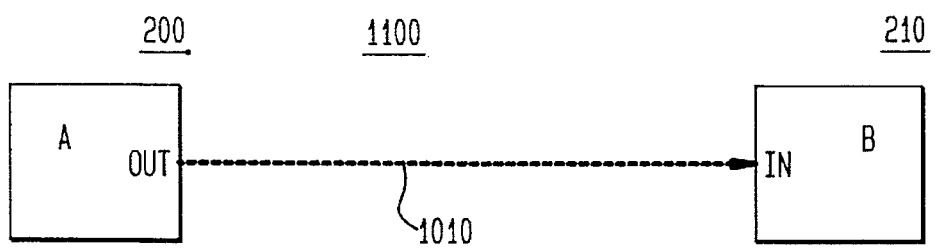
FIG. 11 illustrates two objects connected using Basic Directional Transfer.

For our purposes, we implement BDT in a uniform way no matter which underlying resources are used to implement it. This is done by defining an Object called BDT pictorially shown in FIG. 10(a). The object that implements BDT is abstracted and replaced by a line as shown in the FIG. 10(b). An object A (200) connected to another object B (210) by BDT 1010 is shown FIG. 11.

We define managers like the Basic Data Transfer Manager through their interfaces and an informal description of the services. For BDTM: NBIN, NBOUT, LBIN, LBOUT are interfaces for providing its services. These are very simple interfaces which allows copying of some fixed length data from OUT and to IN and IN to OUT respectively. In the following <self> denotes a reference to any specific instance of the interface.

```
Type: Data:=[1,..,%].{0,1}
Description: BDT;
    Input: NBIN. {Data};
    Output: NBOUT.{Data};
    Services:
    PDC:
        NBIN can only be accessed, NBOUT can only be
        modified. For an unbounded set of positive times s,
        there exists times r(s)>=s and increasing with
        increasing s such that NBOUT(s+r(s))=NBIN(s);
        NBOUT is left continuous everywhere and is constant
        in any interval that does not contain such an s.
    endPDC;
endDescription
Interface: LBIN.{Data};
    Service:
    Local: local.{Data};
    set local= copy_in(LBIN);
endInterface
Interface: LBOUT.{Data};
    Service:
    Local: local.{Data};
    set local = copy_out(local);
endInterface
```

If we connect objects using only BDTs we encounter numerous problems. The history of values assumed by In of B in the Figure will be of course be eventually the history of out of a. In a network of such objects, even though history, in a limited way, is shared, the alignment of one's history with another is lost because BDT does not provide real-time based guarantees and, even if it did, the objects may themselves encounter unpredictable and unmeasurable delays in servicing the messages; and, therefore, many changes in history may go unnoticed. In order to make BDT reliably useful, we need feedback, which requires making it a bi-directional connection. We do this step by step in the following discussion.

Basic Cycle

Figure 12:
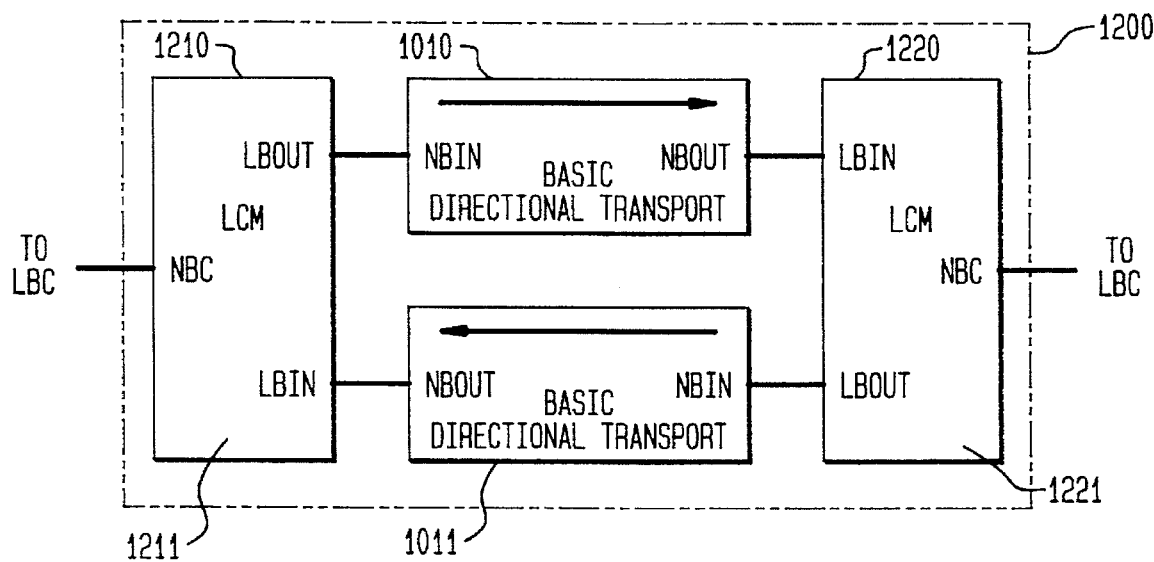
FIG. 12 illustrates the Basic Cycle Manager, providing data distribution, protection, and coordination.

From the Basic Directional Transfer, (such as BDT 1010 and an equivalent BDT 1011 as shown in FIG. 12) we can build a Basic Cycle as in FIG. 12. The Link Cycle Managers (LCM) 1210 and 1220 re-transmit data repeatedly until an acknowledgment arrives from the other side and then completes a cycle as in the alternating bit protocol [TAN89], XON/XOFF, or RTS/CTS [BL88]. The Basic Cycle Manager (BMC) 1200 provides services through another simple cycle interface called NBC, such as NBC 1211 and NBC 1221 of LCM's 1210 and 1220, respectively. Any object having the corresponding LBC Interface can connect to get these services from BCM. The main difference between the Interfaces of BCM 1200 and BDT 1010 are that BCM contains another component called Phase which helps keep the integrity of cycles of interaction between the objects that connect to BCM. If the rules of BCM interfaces are followed, the BCM essentially becomes transparent to these objects. The rules after initialization are simple.

The interface to the Basic Cycle and its services once it is initialized are described below.

```
Type: BC:= [phase.(0,1), data.[1,..,L].{0,1}];
Interface:NBC;
    Input: in.{BC};
    Output: out.{BC};
    services:
    Local: local.{BC};
    set local.in.data = NBC.in.data;
    set NBC.out.data = local.out.data;
    set local.in.phase = NBC.in.phase;
    set NBC.out.phase = local.out.phase;
    set NBC.out.phase = change(NBC.in.phase);
    try local.in.data = NBC.in.data else goto {LABEL};
    try NBC.out.data = local.out.data else goto {LABEL};
    try local.in.phase = NBC.in.phase else goto {LABEL};
    try NBC.out.phase = local.out.phase else goto {LABEL};
    try NBC.out.phase = change(NBC.in.phase) goto {LABEL};
    try initial = install_at(NBC, {LABEL}) else
        goto {LABEL};
    try final = destall_from(NBC, {LABEL}) else
        goto {LABEL};
    PDC:
        Access only NBC.in and modify only NBC.out. For
        initiating a new cycle, change NBC.out.phase to be the
        same as NBC.in.phase. Except for the first cycle, access
        NBC.in and modify NBC.out only when NBC.in.phase
        is not equal to NBC.out.phase. In the first cycle
        initialize NBC.out.phase;
    endPDC;
Interface:LBC;
    Input: in.{BC};
    Output: out.{BC};
    Services:
    Local: local.{BC};
    set local.in.data = LBC.in.data;
    set LBC.out.data = local.out.data;
    set local.in.phase = LBC.in.phase;
    set LBC.out.phase = local.out.phase;
    set LBC.out.phase = change(LBC.in.phase);
    try local.in.data = LBC.in.data else goto {LABEL};
    try LBC.out.data = local.out.data else goto {LABEL};
    try local.in.phase = LBC.in.phase else goto {LABEL};
    try LBC.out.phase = local.out.phase else goto {LABEL};
    try LBC.out.phase = change(LBC.in.phase) goto {LABEL};
    try initial = install_at(LBC, {LABEL}) else goto {LABEL};
    try final = destall_from(LBC, {LABEL}) else
        goto {LABEL};
    PDC:
        Access only LBC.in and modify only LBC.out. For
        initiating a new cycle, change LBC.out.phase to be
        different from LBC.in.phase. Except for the first
        access LBC.in and modify LBC.out only when
        LB.in.phase is equal to LBC.out.phase.
    endPDC;
endInterface
```

As seen above, the interfaces NBC and LBC are exactly the same once initialized. The LBC yields the phase to the NBC when connected. This is the only difference.

Interlocked Protection, Distribution and Coordination are provided by read and write functions at the two ends that only operate on certain parts of the data structures and only at certain times of the cycle. Obviously, read above, while write makes available at the NBC interface the results of the set LBC.out.data or try LBC.out.data services.

This interfaces LBC/NBC can be made into multi-point cycle interfaces instead of two point link interfaces.

Basic Multi-point Cycle (BMC)

The function of this service is to provide a common view for each of the objects connected to its interfaces. Proper implementation of a BMC object, say A, will allow the following equations to be composed:

BMC connections are as:
    a.1.NBMC=x.LBMC
    a.2.NBMC=y.LBMC
    a.3.NBMC=z.LBMC Each object can assume x.LBMC=y.LBMC=z.LBMC at the beginning of each cycle at its LBMC.

This is accomplished by defining the Basic Cycle as a symmetric cycle of merging all the data contributions of all the objects into one Bag and distributing them when all have collaboratively decided to do so in a symmetric way. Bags are like sets except that they allow for multiple copies of the same element. Two Bags are the same, therefore, if every element in one occurs the same number of times in the other and vice versa. The interfaces for the BMC is very much like the BC except for the differing sizes of the Data component to accommodate Bags. NBMC are LBMC are described below:

```
Type: BMC:= [phase.{0,1}, data.[1,..,L*N].{0,1}];
Interface:NDMC;
    Input: in.{BC};
    Output: out.{BMC};
    Services:
    Local: local.[in.{BC}, out.{BMC}];
    set local.in.data = NBC.in.data;
    set NBC.out.data = local.out.data;
    set local.in.phase = NBC.in.phase;
    set NBC.out.phase = local.out.phase;
    set NBC.out.phase = change(NBC.in.phase);
    try local.in.data = NBC.in.data else goto {LABEL};
    try NBC.out.data = local.out.data else goto {LABEL};
    try local.in.phase = NBC.in.phase else goto {LABEL};
    try NBC.out.phase = local.out.phase else goto {LABEL};
    try NBC.out.phase = change(NBC.in.phase) goto {LABEL};
    try initial = install_at(NBC, {LABEL}) else
        goto {LABEL};
    try final = destall_from(NBC, {LABEL}) else
        goto {LABEL};
    PDC:
        Access only NBC.in and modify only NBC.out . For
        initiating a new cycle, change NBC.out.phase to be the
        same as NBC.in.phase. Except for the first cycle, access
        NBC.in and modify NBC.out only when NB.in.phase is
        not equal to NBC.out.phase. In the first cycle initialize
        NBC.out.phase;
    endPDC;
endInterface
Interface:LBMC;
    Input: in.{BMC};
    Output: out.{BC};
    Services:
    Local: local.[in.{BMC}, out.{BC}];
    set local.in.data = LBC.in.data;
    set LBC.out.data = local.out.data;
    set local.in.phase = LBC.in.phase;
    set LBC.out.phase = local.out.phase;
    set LBC.out.phase = change(LBC.in.phase);
    try local.in.data = LBC.in.data else goto {LABEL};
    try LBC.out.data = local.out.data else goto {LABEL};
    try local.in.phase = LBC.in.phase else goto {LABEL};
    try LBC.out.phase = local.out.phase else goto {LABEL};
    try LBC.out.phase = change(LBC.in.phase) goto {LABEL};
    try initial = install_at(LBC, {LABEL}) else
        goto {LABEL};
    try final = destall_from(LBC, {LABEL}) else
```

-continued

```
    goto {LABEL};
  PDC:
      Access only LBC.in and modify only LBC.out. For
      initiating a new cycle, change LBC.out.phase to be
      different from LBC.in.phase. Except for the first cycle,
      access LBC.in and modify LBC.out only when
      LB.in.phase is equal to LBC.out.phase.
    endPDC;
endInterface
```

Figure 13:
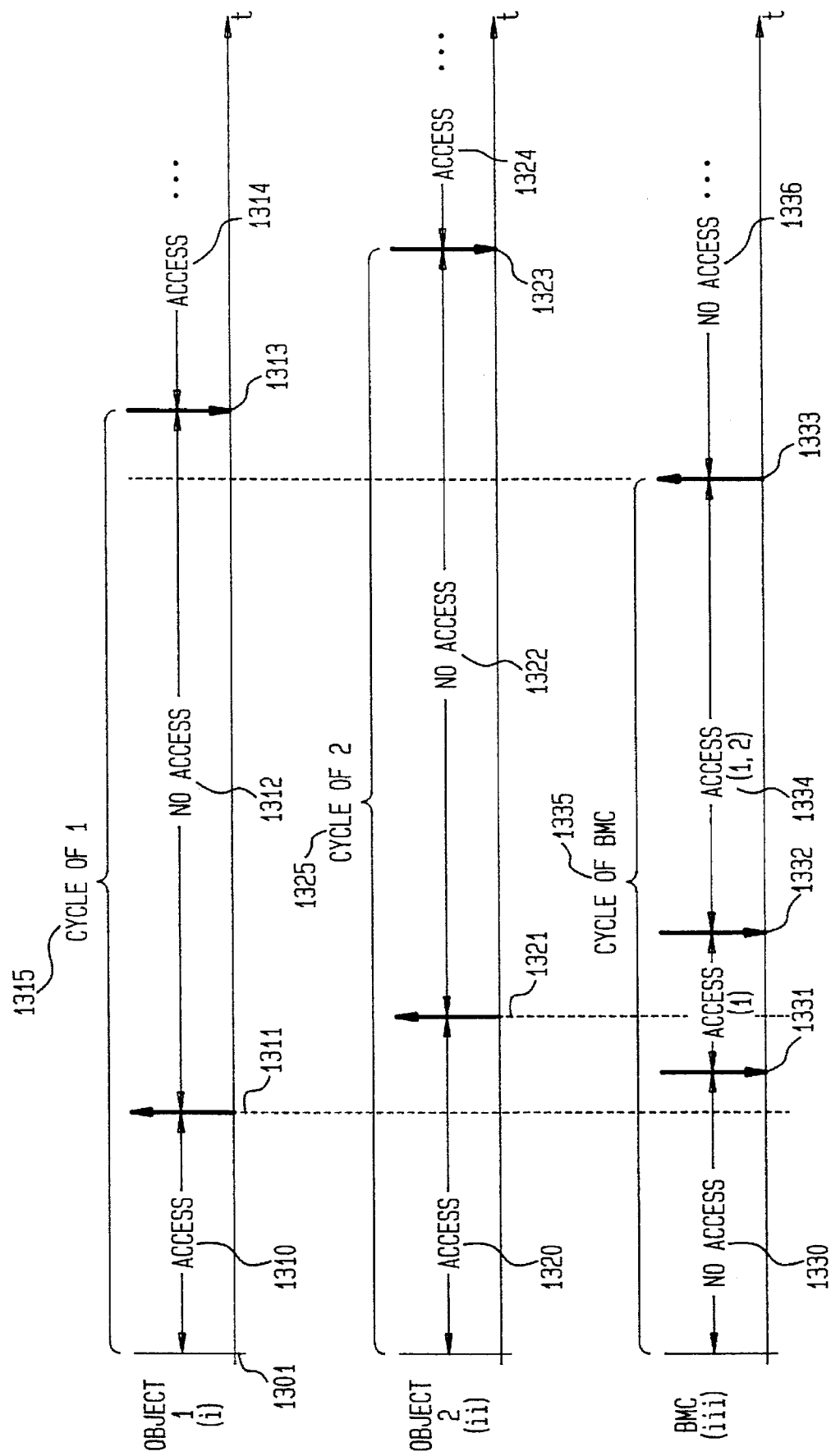
FIG. 13 illustrates a timing diagram for two objects and a Basic Multi-point Cycle.

With reference to FIG. 13, there is shown a timing diagram for two objects (denoted Object 1 and Object 2) and a Basic Multi-point Cycle (BMC), as based on the pseudo-code set forth above for the BMC. The discussion of FIG. 13 uses time point 1301 as the reference point (this time point may be equivalent to, for example, the starting point for the series of basic multi-point cycles after initialization). At time point 1301, Objects 1 and 2 access their respective interfaces (based on the pseudo-code above for an object interface, i.e., the LBMC interface, wherein between the PDC and endPDC delimiters it is stated: "Access only LBC.in and modify only LBC.out . . . only when LBC.in.phase is equal to LBC.out.phase", so at time point 1301 it is postulated that the in.phase and out.phase of each object are equal). In the case of Object 1, the period of access to its interface occurs over the time interval 1310 (see line (i) of FIG. 13). Similarly for Object 2, the period of access occurs over the time interval 1320 (see line (ii) of FIG. 13). For the BMC, however, time interval 1330 (see line (iii) of FIG. 13) following starting time 1301 is a period of no-access, awaiting notification of changed phases in Objects 1 and 2 (based on the pseudo-code above for a basic multi-point cycle interface, i.e., the NBMC interface, wherein between the PDC and endPDC delimiters it is stated: "Access only NBC.in and modify only NBC.out . . . only when NBC.in.phase is not equal to NBC.out.phase", so at time point 1301 it is postulated that the in.phase and out.phase of this interface are not equal). Time interval 1310 ends at time point 1311, when Object 1 changes out.phase to be different from its in.phase; Object 1 then enters a no-access period, designated by time period 1312, during which access to LBC.in and modification of LBC.out are invalid. Time point 1311 is shown by an up-arrow which has the symbolic meaning that a phase change has been posted by Object 1 to its interface. After an unpredictable interval (due, say, to the time delay of interposed propagation media transmitting the phase change indication), measured by the time between time point 1311 on line (i) of FIG. 13 and time point 1331 on line (iii), the BMC detects the phase change in Object 1. The down-arrow has the meaning that a change-of-phase has been detected by the BMC. At time point 1331, the BMC is activated and may obtain data from the interface of Object 1 to begin formation of the bag of data (as shown in the pseudo-code for the BMC that follows: "try bag.[i*L+1,..., (i+1)*L]=interface.i.in.data"). However, since Object 2 has not yet signified a change in the phase flag in its interface, accessing Object 2's data is not yet a valid operation.

At time point 1321 on line (ii), Object 2 has posted a change in phase (up-arrow) to its interface, and Object 2 now enters a no-access state of duration 1322, during which period access to its LBC.in and modification to its LBC.out are invalid. After an unpredictable interval, measured by the time between points 1321 and 1332, the BMC detects the phase change in Object 2. At time point 1332, the BMC may now access its NBC.in and modify its NBC.out interface so as to carry out the process of accumulating data from the interfaces of Objects 1 and 2 to form the complete bag—this period of activity is denoted by time period 1334 on line (iii). After the bag has been formed, time period 1334 is also used to distribute the bag to the interface of each object (as shown in the pseudo-code for the BMC that follows: "distribute"). Upon completion of the distribution of the bag, the BMC posts a change of phase at time point 1333, i.e., NBC.in.phase and NBC.out.phase are made equal, thereby signaling that Objects 1 and 2 may spontaneously advance to the next cycle of processing. After an unpredictable time, measured by the time interval between time point 1333 and time point 1313 (line (i)), the change of phase in the BMC is actually detected by Object 1. Access to LBC.in and modification of LBC.out of Object 1's interface are now valid. A basic cycle 1315 for Object 1 has now been completed; the cycle in this case is measured by the time interval between time points 1313 and 1301.

Similarly, after a delay measured by the time between time point 1323 (line (ii) and time point 1333, the change of phase in the BMC is actually detected by Object 2. Access to LBC.in and modification of LBC.out of Object 2's interface are now valid. A basic cycle 1325 for Object 2 has now been completed; the cycle in this case is measured by the time interval between time points 1323 and 1301. Finally, the BMC has also completed a basic cycle, denoted by the time interval between time points 1333 and 1301, and the BMC enters a non-access period 1336 to again await change of phase indications by both Objects 1 and 2.

Figure 14:
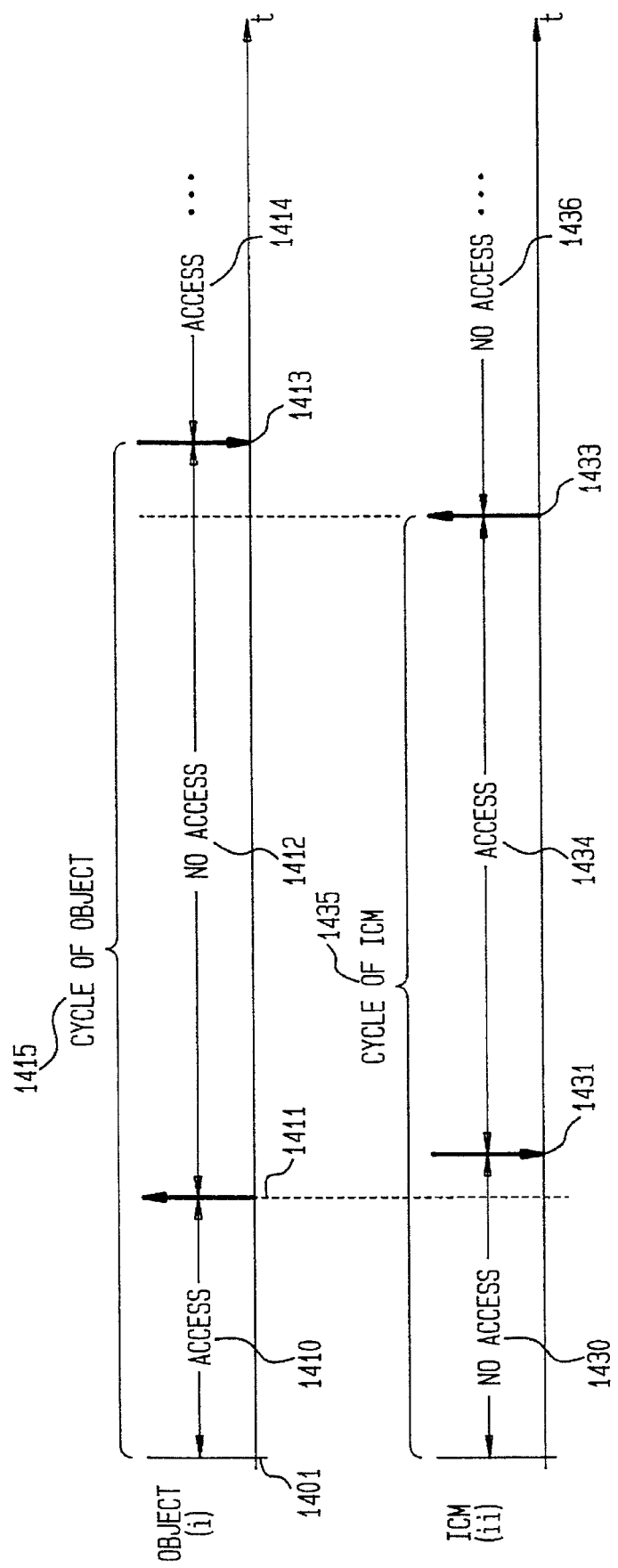
FIG. 14 illustrates a timing diagram for an Interface Cycle.

An Interface Cycle may be described as a subset of the BMC in that only one object interacts with the Interface Cycle Manager (ICM)—which is commensurate with the BMC in this special case. With reference to FIG. 14, there is shown a timing diagram for the Object and the ICM, as based on the pseudo-code set forth above for the ICM. The discussion of FIG. 14 uses time point 1401 (see line (i) of FIG. 14) as the reference point (this time point may be equivalent to, for example, the starting point for the series of basic cycles after initialization). At time point 1401, the Object accesses its interface. For the ICM, however, time interval 1430 (see line (ii) of FIG. 14) following starting time 1401 is a period of no-access, awaiting notification of a changed phase in the Object.

Time interval 1410 ends at time point 1411, when the Object changes its out.phase to be different from its in.phase; the Object then enters a no-access period, designated by time period 1412, during which access to LBC.in and modification of LBC.out are invalid. Time point 1411 is shown by an up-arrow which has the symbolic meaning that a phase change has been posted by the Object to its interface. After an unpredictable interval (due, say, to the time delay of interposed propagation media transmitting the phase change indication), measured by the time between time point 1411 on line (i) of FIG. 14 and time point 1431 on line (ii), the IMC detects the phase change in the Object. The down-arrow has the meaning that a change-of-phase has been detected by the ICM. At time point 1431, the ICM is activated and may obtain data from the interface of the Object to begin formation of the bag of data.

After the bag has been formed, access time period 1434 is also used to distribute the bag to the interface of the Object. Upon completion of the distribution of the bag, the ICM posts a change of phase at time point 1433, i.e., NBC.in.phase and NBC.out.phase are made equal, thereby signaling that the Object may spontaneously advance to the next cycle of processing. After an unpredictable time, measured by the time interval between time point 1433 and time point 1413 (line (i)), the change of phase in the ICM is actually detected by the Object. Access to LBC.in and modification of LBC.out of the Object's interface are now valid. A basic cycle 1415 for the Object has now been completed; the cycle in this case is measured by the time interval between time points 1413 and 1401. The Object now enters the access period 1414 of the next basic cycle.

Finally, the ICM has also completed a basic cycle, denoted by the time interval between time points 1433 and 1401, and the ICM enters a non-access period 1436 to again await change of a phase indication by both the Object.

BMC's operation is very simple. When all of its NBMC interfaces have changed phases, all objects connected to them have completed a new set of modifications to their own LBMC interfaces. They are all then waiting to detect a phase change. BMC gathers all of the new bags from the objects and makes a single new bag. It then delivers them to each one of its own NBCM interfaces. This makes the basic unit of data distributed to be lossless and the distribution itself to be symmetric in the sense all the data is available to all of the parties each of the cycles. By not restraining the cycle externally and preserving the contributions of each without necessarily identifying object names BMPC abstracts the interfaces to a common coordinated interface.

---
BMC Description
---

Figure 15:
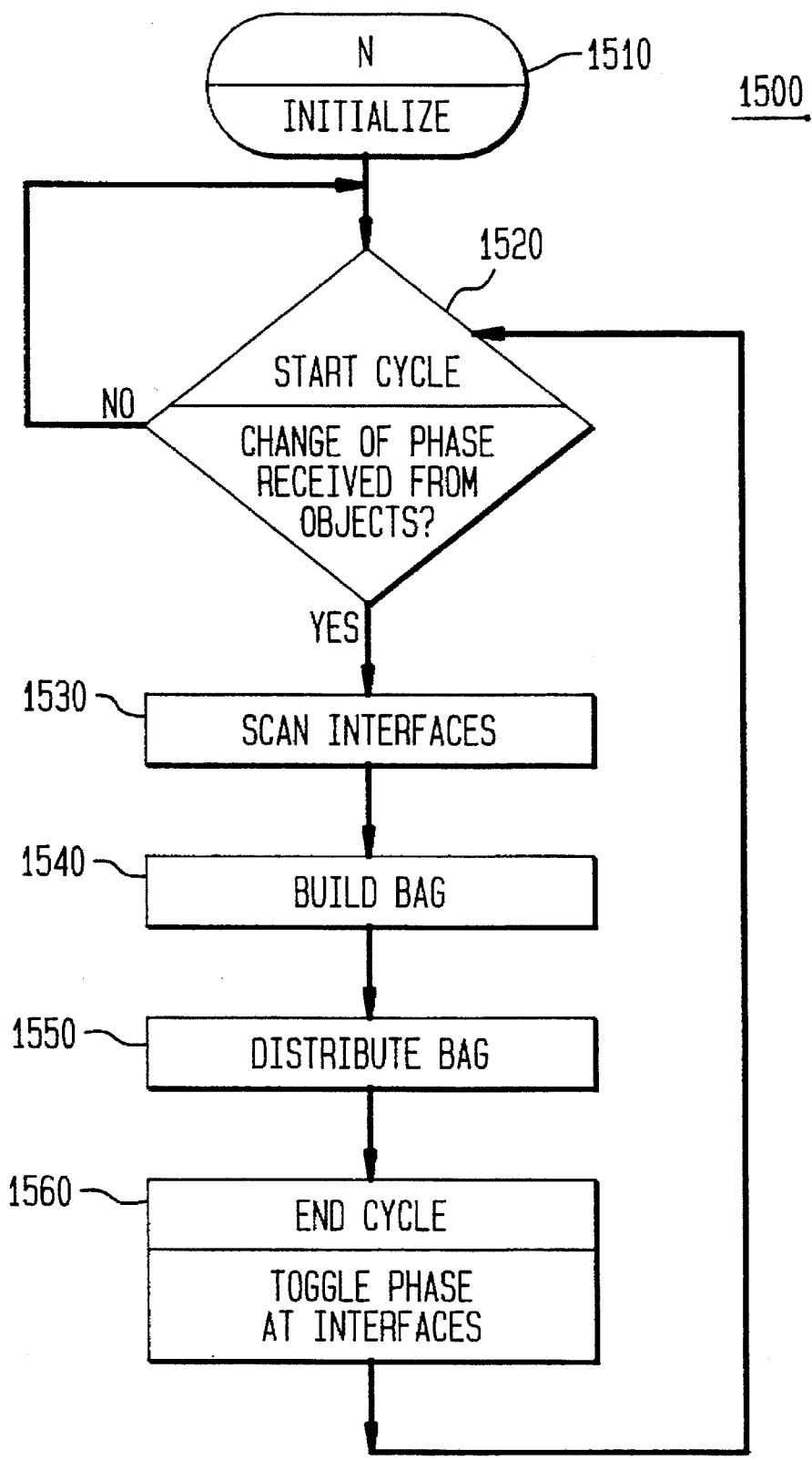
FIG. 15 illustrates a flow diagram for a N interface.
Figure 16:
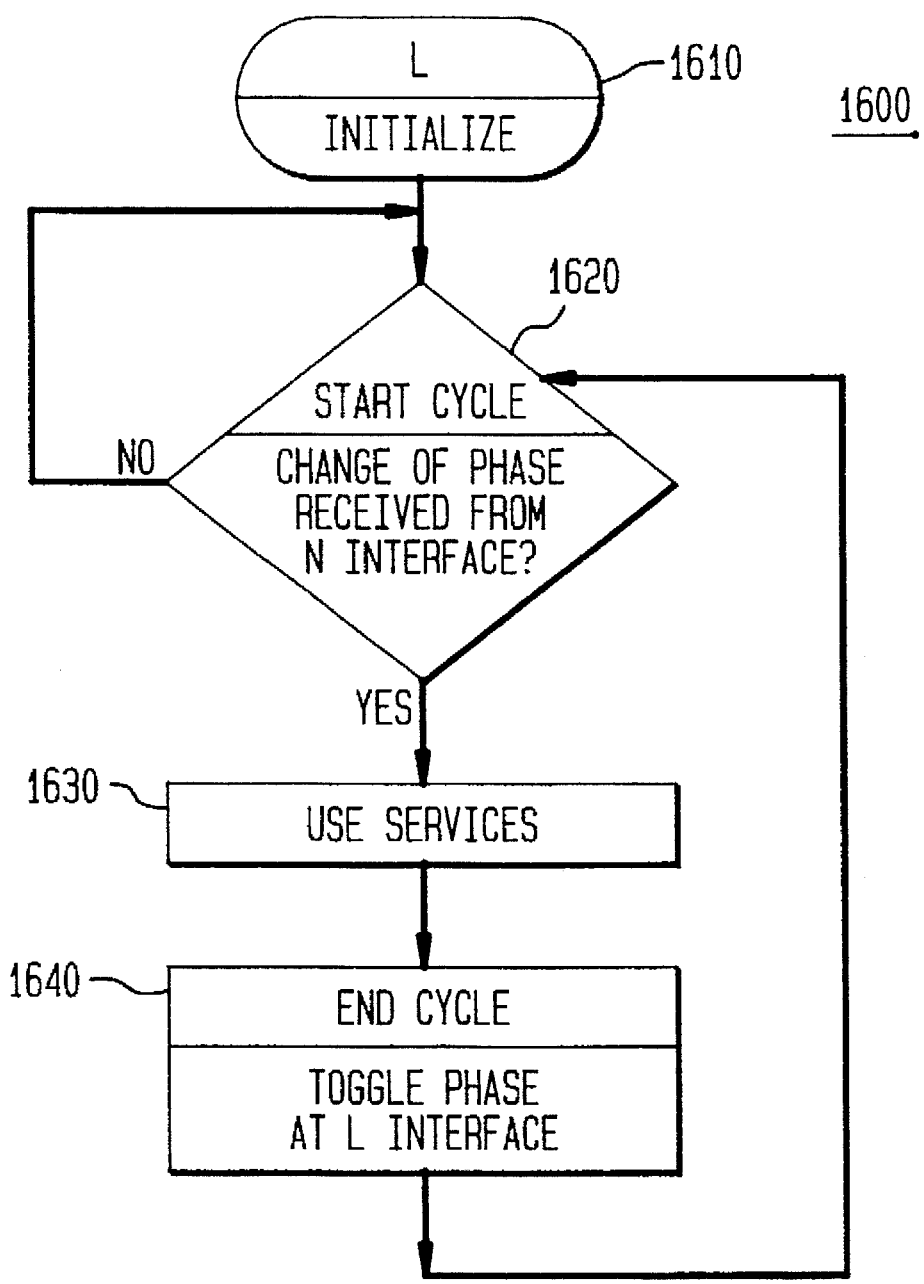
FIG. 16 illustrates a flow diagram for a L interface.

Description: Basic_Multipoint_cycle(BMC):
  Interface: interface.[1,..,N].{NBMC};
    Script:
    Local:
    bag.{BMC}
    ready.[1,..,N].{yes, no};
    total.{INTEGER};
    endLocal;
    Initialise:
    set Interface.[*].out.phase = 1;
    set global_phase = 1;
    cycle:
    i=0;
    total = 0;
    next:
    set i = i+1;
    if ready.i = no then
      try bag.[i*L+1,..,(i+1)*L] = interface.i.in.data
      else goto skip;
      set ready.i = yes;
      set total = total + 1;
    endif;
    skip:
    if total = N then goto distribute;
    if i = N then set i = 0;
    goto next;
    distribute:
    i=0;
    total = 0;
    d_next:
    set i = i+1;
    set interface.i.out.data = bag;
    set interphase.i.out.phase =
    change (interphase.i.in.phase);
    if i < N then goto d_next;
    set global_phase = change (global_phase);
    PDC:
      Synchronize the change of phase of all the NBC
      interfaces in coordinated cycles.
    endPDC;
  endInterface;
endDescription The flow diagram 1500 corresponding to the above pseudo-code for the N interface is shown in FIG. 15, whereas the flow diagram corresponding to the above pseudo-code for the L interface is shown in FIG. 16. With reference to FIG. 15, processing block 1510 is first invoked to initialize the BMC's N interface. Next, processing block 1520 is invoked to determine if the N interface has received phase change indications from the objects associated with the N interface—block 1520 is shown as being the starting point in the cycle ("Start Cycle"). There are at least two options to consider with respect to detecting the phase indications. One option, depicted in FIG. 15, is to wait until all objects associated with a given N interface have provided phase change indications. Then the N interface is proceeds to processing block 1530 wherein the L interfaces are scanned for input. An alternative arrangement, depicted by the timing diagram of FIG. 13, is to process each object as it signals the N interface that the object's interface can be accessed. The latter case is more efficient in that the formation of the bag may be ongoing as each object allows access to its interface. Continuing with the description of FIG. 15, the next processing stage is entered via block 1540 which denotes formation of the bag from the data obtained from the L interfaces. After the formation of the bag, processing block 1550 is entered to distribute the bag to the L interfaces. Block 1560 denotes that at the end distribution of the bag, the phase of the N interface is toggled so as to alert all L interfaces associated with the BMC that their period of no-access is completed—processing block 1560 is the end of the BMC cycle ("End Cycle"), and the "Start Cycle" block 1520 is re-invoked at this point in the processing.

Now, with reference to FIG. 16, flow 1600 is the processing representative of each L interface associated with a given BMC's N interface. Processing block 1610 again signifies an initialization stage, followed by the processing of block 1620—the "Start Cycle" for the L interface. As indicated, the L interface awaits a change of phase indication as delivered by the N interface. Once this phase indication is registered by the L interface, processing block 1630 is invoked wherein the L interface uses its local services. When the L interface has completed its use of the local services, processing block 1640 is entered to toggle the phase of the L interface so as to inform the associated N interface that the L interface has entered the period of no-access between its local services and the L interface. After toggling, the "Start Cycle" block 1620 is re-invoked.

Dynamic Multi-point Cycle (DMC)

Figure 17:
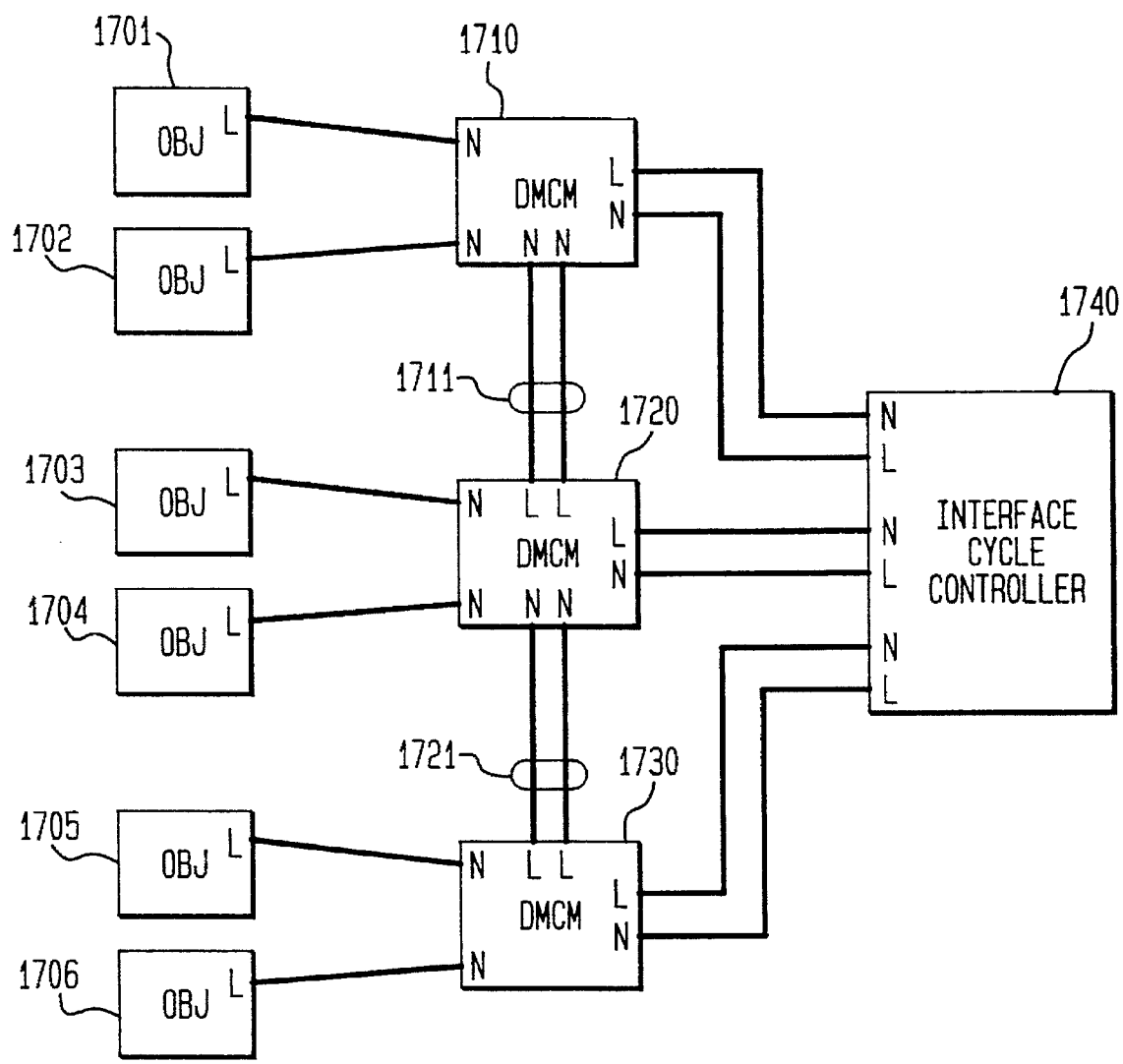
FIG. 17 illustrates an Atomic Interface Description, showing exposed interfaces and an exposed Interface Cycle.

The Dynamic Multi-point Cycle allows dynamic changes in the system configuration. These changes can be made while the system is active, providing capabilities analogous to "hot plug in" hardware. The Dynamic Multi-point Cycle Manager (DMCM) 1710 is situated as shown in FIG. 17, managing a set of L-type interfaces for client objects (labeled OBJ) 1710 and 1702, and connected to zero, one, or two other DMCMs via set of Basic Cycles, allowing the DMCMs to communicate with one another in cycles. For instance, in FIG. 17, DMCM 1730 connects to DMCM 1710 via Basic Cycle 1721, whereas DMCM's 1710 and 1720 are coupled by Basic Cycle 1711. Neighboring DMCMs, interconnected by BCs, are not peers. One of them always has higher priority than the other. Specifically, with respect to the BCs between them, the DMCM with the L-type interfaces is of lower priority than the DMCM with the N-type interfaces. Thus DMCM 1730 is of a lower priority compared to DMCM 1720. In addition, DMCM's 1710, 1720, and 1730 are coupled to Interface Cycle Controller 1740, whose function will be described below.

Each set of objects connected to a DMCM and labeled OBJ in FIG. 17 share a Multi-point Cycle. However, they do not share this cycle directly with each other as they would if they were participating in a Basic Multi-point Cycle. Instead, cycles are always mediated by the DMCM. There are several directions (routes) in which cycles may proceed. At each level (priority), an object can request, through its cycle with the DMCM it is connected to, a direction in which the cycle should proceed. This request also allows it specify which possible directions it is agreeable with, since all objects may not always agree on a common direction, and latitude may allow a consensus direction. The DMCM routes Cycle based on inputs from these Objects and a set of rules. The priority of the levels relative to each other guarantees certain invariant properties in the direction which is selected by the DMCM Whenever the OBJ interfaces at the next higher level collectively want to intercept the cycle of the lower level they can do so. This is because in every cycle, after a phase change has occurred on the IN side of the BC to each OBJ, a level waits for permission from the higher level to proceed to the second part of the cycle. If permission is granted for a particular set of directions it selects a valid direction and completes its distribution functions. If the only permitted direction is to the higher level it hands over the bag to the higher level to distribute to the OBJ interfaces at the higher level. If, on the other hand the level wants attention from the one above to get the current cycle intercepted, it waits for the upper level to give attention. Once a level is in the waiting mode for the higher level, it does not proceed to the second half of the cycle in progress, until the higher level has authorized it, at which time it distributes the inputs from the higher level to the outputs of the lower level.

This control of routing of inputs to outputs is coordinated with components of the N-type and L-type interfaces that, at each level attempt to set the routing pattern at their own level and at the next lower level. The pattern set for the lower level can be changed in every cycle. However, if the level itself is currently routed to the higher level, the route setting for the lower level is unaltered in the period while the cycle with higher level is in progress.

Since the muting is decided between the higher and lower levels and the OBJ Interfaces connected to the DMCM, there is method to resolve requests to set direction. Each cycle can only be directed in one unique direction. The priority and consensus forming is explained below:

On each level, the request set on the interfaces is fused to into a single request that is then resolved with the requirements of the higher level. The method involves a rule that can be implemented on two requests at a time, where the requests can be non-deterministic (the requester can allow the DMCM to choose from one of a set of allowable choices). Within these constraints, actual policies are implemented via an installable function into the DMCM.

| Dynamic Multi-point Cycle: |
| --- |
| Remark |
| We need some new services over the BC, to describe DMC; |
| They are: |
| ***Set are unsafe, if operations are not consistent with phase states |
| of input and out put at the interface they are in error.; |
| set_write |
| set_read |
| ***Next two do the same as above, but also atomically changes the |
| phase. |
| set_write_change |
| set_read_change |
| ***Tries are safer, if inalid they fail. |
| try_write |
| try_read |
| try_write_change |
| try_read_change |
| ***Next wait one new cycle before returnig; |
| try_write cycle |
| try_read_cycle |
| try_cycle_read |
| try_cycle_write |
| Remark |
| Pseudo code for DMCM, as the previous example of Interface Cycles we |
| specify the extensions to the interfaces and then the description of |
| operation of DMCM. |
| endRemark; |
| Remark; |
| D_Events are the distribution events which set, as a group, |
| directions for data and control. |
| endRemark; |
| Type: D_Event:= [up, level, down].{yes, no, y&n}; |
| Remarks: |
| For the NDMCI: |
| d_global is the distribution direction of the current cycle. |
| d_level is the ditribution direction wanted as a group by the level |
| d_lower is the new ditribution direction set by group for the lower |
| level. |
| d_lower_req is the requested distribution direction by the group at |
| lower level. |
| endRemark; |
| Type: NDMC:= [phase.(0,1), data.[1,..,L*N], [d_global, d_level, |
| d_lower, d_lower_req].{D_Event}]; |
| Remark: |
| For LDMCI: |
| d_level is the distribution direction wanted by the interface. |
| d_lower is the distribtuion direction of the lower level wanted by |
| the interface |

-continued

| Dynamic Multi-point Cycle: |
|---| endRemark;
Type: LDMC:= [phase.(0,1), data.[1,..,L].{0,1}, [d_level,
d_lower].{D.Event}];
Interface:DMCI:=
Input: in.{LDMC};
Output: out.{NDMC};
endInterface;
Description: Dynamic Multipoint Cycle Manager(DMCM):=
Remark
The LBC and NBC interfaces are for the level to communicate with the
higher and lower levels or Interface Cycle Controllers.
endRemark;
Interfaces:
level.[1,..,N].{DMCI};
control, h_d_event, h_global:={NBC};
    control.data.[have_up, have_down, active.[1,..,N]].{yes,
    no},h_d_event.data.{D_Event};h_global.data.{NDMC}
control, l_d_event, l_global:={LBC};
    control.data.[have_up, have_down, active.[1,..,N]].{yes,
    no},l_d_event.data.{D._Event};l_global.data.{NDMC}
endInterfaces;
Script:
Locals:
have_up.{yes, no};
have_down.{yes, no};
active.[1,..,N].{yes, no};
c_acive.[1,..N];
ready.[1,..,N].{yes, no};
local.[1,..,N].{LDMCI};
global.{NDMCI};
total.{INTEGER};
endLocals;
Initialisation:
have_up = no;
have_down = no;
Remark
Initialise all the L interfaces at the level;
endRemark;
start: try_cycle_read (have_up, have_down, active) = control else
goto start;
cycle:
set (have_up, have_down, active) reset(control);
intialise_cycle;
initialise_cycle:
set i=0;
set total = 0;
set first_time = yes;
******Initialise local, and global correctly
Remark:
Gather the input data and events prior to distribution.
endRemark;
next:
set i = i+1;
Remark
Start polling each interface for new cycle and associated input. The
program IP copies the input from the interface to the correct
positions of the global data structure and also sets d_Events. Since
some of these are only formed by consensus, the variable first_time
allows sequencing consensus forming one at a time.
endRemark
if ready.i = no AND active.i = yes then
    try global = IP(first_time, level.i) else goto skip;
    set first_time = no;
endif;
set ready.i = yes;
set total = total + 1;
if total = N goto distribute;
skip:
try_cycle_read local.d_lower_req = l_d_event else goto go_on;
try_cycle_write l_d_event = local.d_lower else goto go_on;
go_on: if i = N then set i = 0;
set (have_up, have_down, active) = reset(control);
goto next;
distribute:
Remark
Ask higher level for permit.
Get d_higher which is the setting by the higher level for controlling
the distribution at level, from the higher level by simply reading

| Dynamic Multi-point Cycle: |
|---| after cycling, because higher level should be able to change the
distributionn pattern of level every cycle of level.
endRemark;
ask_up: try_cycle_read d_higher = h_d_event else ask_up;
set global = permit(d_higher, global)
set local.d_lower = global.d_lower;
if global.d_global = #[no, no, no] then goto ask_up;
set done = OP(global);
***Change the global_phase by flippint 1 to 0 or vice versa.
***somewhere the above should come.
set global_phase = change(global_phase);
cycle;
endScript;
PDC:
Synchronize the change of phase of all the NDMC interfaces in
coordinated cycles, however route the data according to resolved
priorities as described below in the functions.
endPDC;
Remark:
See whether active list and have_up, have_down has changed;
Find the new active list from the control channel, notice that if try
does not read then cycle will any way progress. So new connections
have to wait.
endRemark;
Description: reset:=
[have_up, have_down, active.[1,..,N].{yes, no};
Script:
Local: c_active.[1,..,N].{yes, no};
try_read_cycle (have_up, have_down, c_active) = control else return;
set i = 0;
activate:
set i = i+1;
if c_active.[i] = yes AND active.[i] = no then set level.i.out.phase
= global_phase;
if i<N then activate;
return;
endDescription;
Description: IP:=
global.{NDMCI};
level.i.{LDMCI};
Usage: try (global, first_time) = IP(level.i, first_time);
Script:
Rmark:
Collects the data from the LDMC interface and puts it into the
format and populates the fields of the data structure as needed. It
succeeds on a phase change after completing the update to global.
endRemark;
on level.i.in.phase = level.i.out.phase:
set global.data.[(i*L)+1,..,(i+1)*L] = level.i.in.data
if first_time = yes then set global.d_level = level.i.in.d_level;
if global.d_level.i.up != level.i.d_level.i.up then set
global.d_level.i.up = y&n;
if global.d_level.i.level != level.i.d_level.i.level then set
global.d_level.i.level = y&n;
if global.d_level.i.down != level.i.d_level.i.down then set
global.d_level.i.down = y&n;
if first_time = yes then set global.d_lower = level.i.d_lower;
if global.d_lower.up != level.i.d_lower.up then set global.d_lower.up
= y&n;
if global.d_lower.level != level.i.d_lower.level then set
global.d_lower.level = y&n;
if global.d_lower.down != level.i.d_lower.down then set
global.d_lower.down = y&n;
first_time = no;
endif;
return;
endDescription;
Description: permit:=
Type: global.{NDMCI};
Type: d_higher.{D_Event};
Usage: set global permit(d_higher, global);
Script:
Local: local.d_global.{D_Event};
set local.d_global = global.d_level;
if d_higher.up != yes then set local.d_global.up = no;
if d_higher.level != yes then set local.d_global.level = no;
if d_higher.down ! yes_then set local.d_global.down = no;
if local.d_global.[yes, *, *] then set local.d_global.[level, down] =

-continued

---
Dynamic Multi-point Cycle:
---

```
no;
if local.d_global.[*, yes, *] then set local.d_global. [up, down] =
no;
if local.d_global.[*, *, yes] then set local.d_global.[up, level] =
no;
Return;
EndDescription;
Description OP:=
global.{DMCM};
Script:
if global.d_global = #[yes, no, no] then goto send_higher;
if global.d_global = #[no, yes, no] then goto send_level;
if global.d_global = #[no, go, yes] then goto send lower;
Remark:
Send global to the higher level where it replaces the data of global
to the data for the current cycle and distributes at the higher
level.
Level, in the mean time waits for a response on the cycle to finish,
and then distributes to the level interfaces.
endRemark;
send_higher:
send_h:
set (have_up, have_down, active) = reset(control);
if have_up = no then return;
try_write_cycle h_global = global else send_h;
set_read global.data = h_global;
goto send_level;
Remark:
Send global to level interfaces.
endRemark;
send_level:
set (haveL_up, have_down, active) = reset(control);
if have_down = no then return;
if global.d_lower = [yes, no, no] then
    try_cycle_read global.[data] = 1_global;
else
endif;
i=0;
p_next:
set i = i+1;
if active.i = yes then
    set_write_change level.i = global;
endif;
if i < N then goto p_next;
return;
Remark:
Send global to lower level but not wait.
endRemark;
send_lower:
set_write_change L_global = global;
return;
```

Static Interface Cycle

The Static Interface Cycle is a Basic Multi-point cycle which is enhanced with critical functions for protection and exception handling. At the change of every phase, Static Interface Cycle Managers (SICMs) indicate the various exceptions that could occur in a realistic environment SICMs distinguish between the exceptions explicitly created by the objects or exceptions arising from violation of a protection policy.

Every phase change at the LSIC interface is accompanied by a coordination event. These are used to signal exceptions explicitly generated by the Objects and delivered via the object interface. Coordination events include: off (no exception condition), abort, retract, and repeat. Abort takes precedence over retract and repeat, and retract takes precedence over repeat. Abort represents the most serious condition, and should not be signaled by an object unless it deems it necessary to reinitialize the interface. Retract is a less serious event and, in general, should be used to signal all interfaces to begin processing as they had just entered the previous phase of the SIC (two phase transitions prior to the most recent one). A repeat event signals objects to restart processing at the current phase (one phase transition prior to the most recent one). The off event accompanies any phase transition in which there is no abort, retract, or repeat. Unless the prior coordination event was off, the data component of LSIC interface is unreliable (i.e. attempting try on the data will not succeed).

The SICM is configured with special programs that protect the interfaces connected to it. These programs, called Input Protection Programs (IP) and Output Protection Programs (OP), are loaded into the SICM using a protection scheme that allows only authorized agents to load them when an SICM is initially configured. This could be any one of the digital signature verification schemes described in [OM90] for example. The scheme might depend on application requirements and does not have to be uniform. However, the point at which the IP and OP are executed, namely the point where all the interfaces connected to an SICM have changed phase, but the SICM itself has not changed the phases of its NSIC interfaces, is important. Checking the data presented in each cycle for various forms of validity, just after it is output and just before it is input to a group of other interfaces, allows protection violations to be captured at logically well defined points. Each protection program that is referred to in the following description of SICM can be specific to the individual interface. Therefore, references to programs include references to their own local data spaces wherein a program could keep information about the particular interface it is managing. This allows the program to apply protection requirements which are based on the number of elapsed cycles, for example. As a minimum, the IP and OP programs should implement the exception handling discussed in the previous paragraph, and set the coordination event to be received it their respective interface at the next phase transition.

Some other functions that could be included in these programs are:

1. Verification of digital signature of the data entering into any of the input interfaces to check whether the data was output by valid agents and whether inputting of such data to the output interfaces is authorized by corresponding agents.

2. Transformation of data into formats compatible with output interfaces such as changing byte ordering 3. updating or retrieving data from heterogeneous data bases.

```
Type: C_Event := {Repeat, Retract, Abort, OFF}
Type: P_Event:= [in, out].{ON, OFF};
Type: NSIC:= [phase.{0,1}, data.[1,..,L*N].{0,1}, c_global.{C_Event},
p_local.{P_Event}, p_global.[P_Event}];
NSIC_normal = [phase.1, data = [1,..,L*N].0, c_global.OFF,
p_local.[in, out].OFF, p_global.[in, out].OFF];
Type: LSIC:= [phase.{0,1}, data.[1,..,L].{0,1}, c_local.{C_Event}];
LSIC_normal = [phase.0, data.[1,..L].0, c_local.OFF];
Interface: NSICI;
    Input: in.{LSIC};
    Output: out.{NSIC};
endInterface
Interface: LSICI;
    Input:in.{NSIC};
    Output: out.{LSIC};
endInterface;
Description: Static_Interface_Cycle(SIC);
    Interface: level.[1,..,N].{NSIC};
    Script:
    Local:
    Protection.[1,..,N].[IP, OP].{Process}
    ready.[1,..,N].{yes, no};
    global.{NSIC};
    total.{INTEGER};
    Initialize:
    set level.[*].out.phase = 1;
    set global_phase = 1;
    endInitialize;
    cycle:
    set i=0;
    set total = 0;
    set global NSIC_normal;
    next:
    set i = i+1;
    if ready.i = no then
            try (level.i, global) = protect.i.IP(level.i) else goto
            skip;
    endif;
    set ready.[i] = yes;
    set total = total + 1;
    if total = N goto distribute;
    skip:
    if i = N then set i 0;
    goto next;
    distribute:
    i=0;
    p_next:
    set i = i+1;
    cycle {level.i.out}= protect.i.OP(global);
    if i < N then goto p_next;
    global_phase = change(global_phase);
    goto cycle;
    PDC:
    Synchronize the change of phase of all the NSIC interfaces in
    coordinated cycles after running both the IP and OP programs as
    indicated.
    Constraints on IP Programs:
    Usage:
    try (level.i, global) = protect.i.IP(level.i);
    when the phase change at the interface occurs, the protection
    program should:
    Set protection events:
```

```
    if IP detects an input violation then
        set level.i.p_local.in = ON;
        set global.p_global.in = ON;
    else
        set level.i.p_local.in = ON;
        set global.p_global.in = ON;
    endif;
Set coordination events:
if local.i.c_event !=OFF then
    if local.i.c_event = abort then
        set global.c_event = abort;
    else
        if local.i.c_event = retract then
            if global.c_event != abort then
                set global.c_event = retract;
            endif;
        else
            if global.c_event != abort then
                if global.c_event != retract then
                    set global.c_event = repeat;
                endif;
            endif;
        endit;
    endif;
endif;
Constraints on OP Programs:
Usage:
cycle (level.i.out) = protect.i.OP(global);
update level.i.out and change the phase of level.i.out and
should:
Set protection events:
do not set any input protection events;
if OP detects an output protection violation then
    set level.i.out.p_local.out = ON;
else
    set level.i.out.p_local.out = OFF;
endPDC;
endDescription
```

Figure 18:
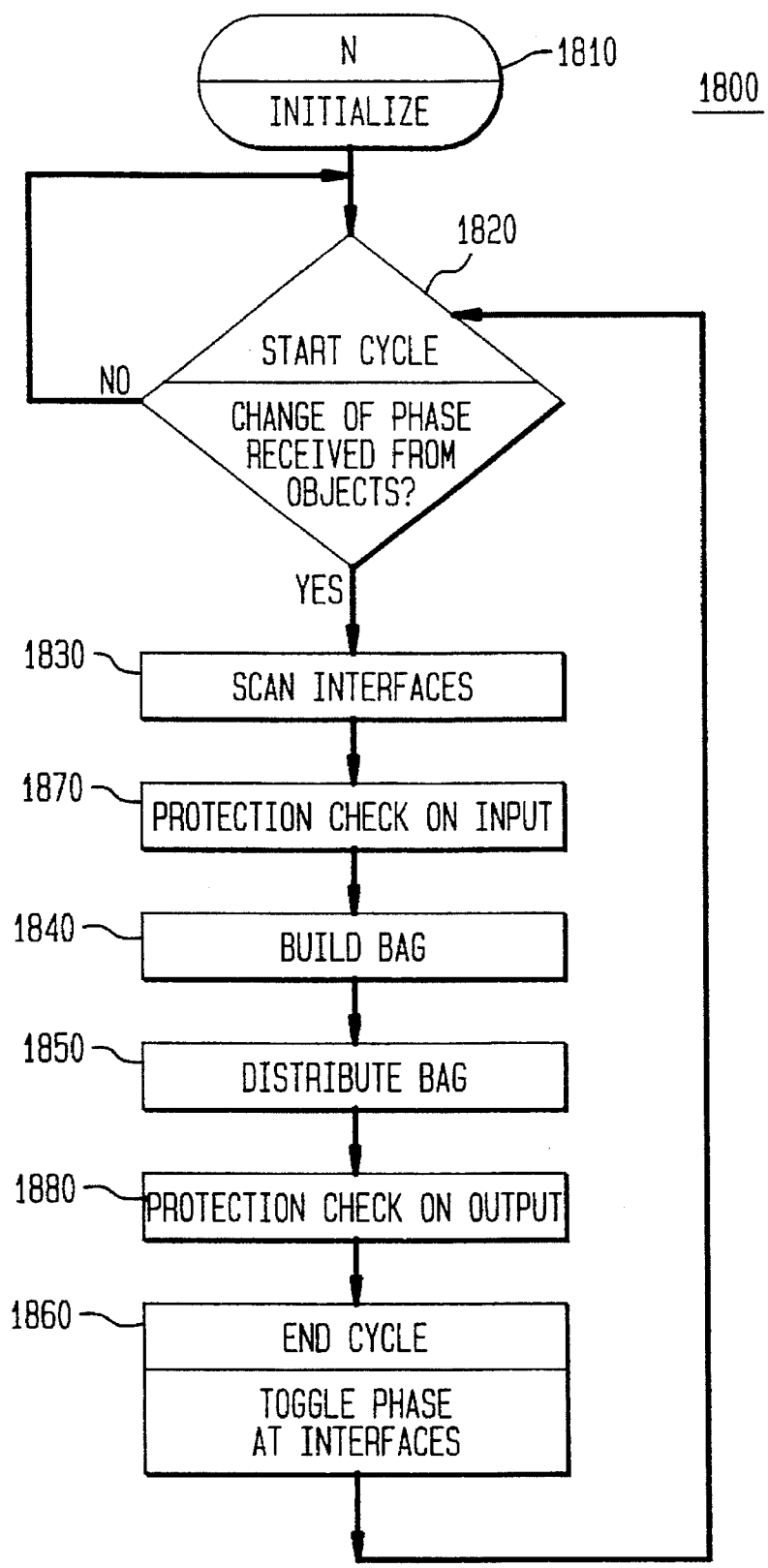
FIG. 18 is a flow diagram for an N interface having input and output protection.

Flow diagram 1800 of FIG. 18 depicts the sequence of steps carried out by a N interface having input and output protection as set forth in the foregoing pseudo-code; FIG. 18 is commensurate with FIG. 15 wherein the primary differences are the addition of block 1870 to provide the protection check upon the reception of data from the L interfaces, and the inclusion of block 1880 to provide the protection check upon the distribution of the bag to the L interfaces.

Dynamic Interface Cycle (DIC)

The Dynamic Interface Cycle provides the union of the capabilities of the Dynamic Multi-point Cycle (DMC) and the Static Interface Cycle (SIC) discussed previously. The IP and OP installable functions implement both protection and routing policies; and initiate coordination, protection and routing events.

In order to implement Dynamic Interface cycles, one would construct an interface whose description manages Exceptions or Coordination Events (C_Event) and Protection Events (P_Event) in exactly the manner described in the Interface Description for Static Interface Cycles, and whose description manages distribution events (D_Event) exactly as described in the Interface Description for Dynamic Multi-point Cycles. The installable functions IP and OP will establish the policies under which all three of the above event types are generated.

Extended Cycle

An Extended Interface Cycle is an enhancement to all Multi-point Interface Cycles wherein each interface maintains additional information on the start and end of the extended Cycle. This allows multiple atomic interactions over each interface (Basic Cycle) to take place for each phase transition of the Multi-point Cycle. In order to inclement Extended Interface Cycles, one would add to the data structure type BC, defined in the section on Basic Cycles, a new item called micro_phase. BC.micro_phase would then be used in place of BC.phase in all behaviors of both sides of the BC interface. A new service called change_phase would be made available at the interface, which would be used to explicitly change the phase of the interface as far as the Multi-point Cycle is concerned. Hence, the individual interfaces would function based on BC.micro_phase, while the Multi-point Cycle would continue to function on BC._phase.

Interface Cycle Objects, Descriptions and Composition

Atomic Descriptions are like event driven programs. They continue to sequence through operations and branch to specific sequences determined by the event detected by the program. To describe these operations, a minimal notation is needed because of the variety of names and operations that are necessary. Therefore, we start by explaining the notation used in this application.

Figure 19:
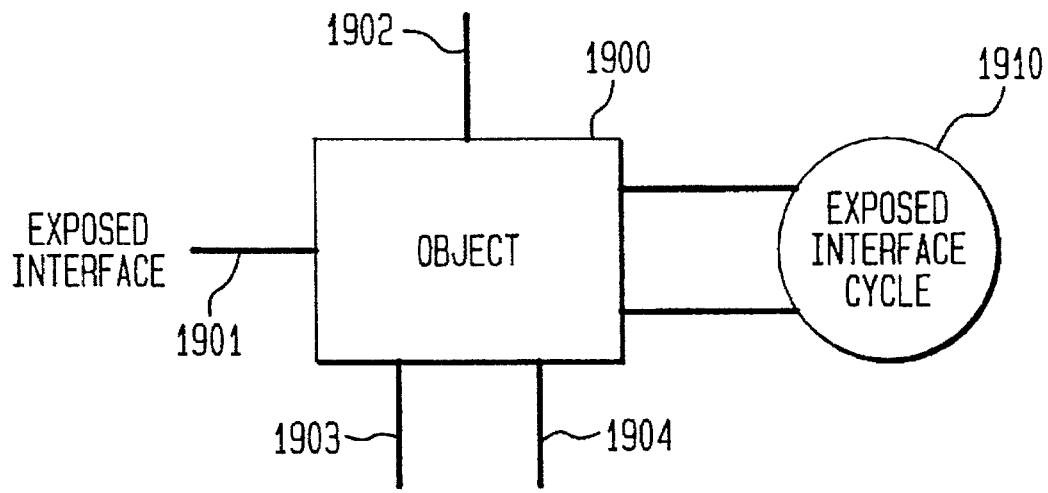
FIG. 19 illustrates a Dynamic Multi-point Cycle Hierarchy and Interface Cycle Controller.

An Atomic Interface Description for object 1900 in FIG. 19, is a list of Exposed Interface Cycles (such as cycle 1910), a listing of Exposed Interfaces (such as 1901–1904), a list of connections between component objects, an Atomic Cycle, a Domain of Local Names, and a flow chart (or script) which is interpreted relative to the Atomic Cycle and the Domain of Local Names. The flow chart may be replaced by any method to describe a sequence of operational steps relative to the Atomic Cycle. Such operations include operations on Interfaces. For example, a sequential program is one with a specified Atomic Cycle specifying the atomic steps, namely steps during the execution of which, none of the local names can change. Another example is the description as a finite state machine. To avoid any particular programming language, we use flow charts or pseudo code as a means to describe the sequence of actions. Every local name in the domain has a history relative to the Atomic Cycle, and the Description causally constrains the atomic changes in the history of values of these names. Starting with initial values for Local Names and Interfaces, at each step (Atomic Cycle), the description specifies a possible set of changed names and their possible values. Changes in name values are atomic with respect to the Atomic Cycle. Any value not changed in a step retains the value from the previous step. In any description, inconsistent operations on ports are eventually indicated by a violation. So, operations on Interface Ports that are inconsistent do not change the behavior of the Interface Cycle. They may, however, lead to incorrect results in the Object.

Figure 20:
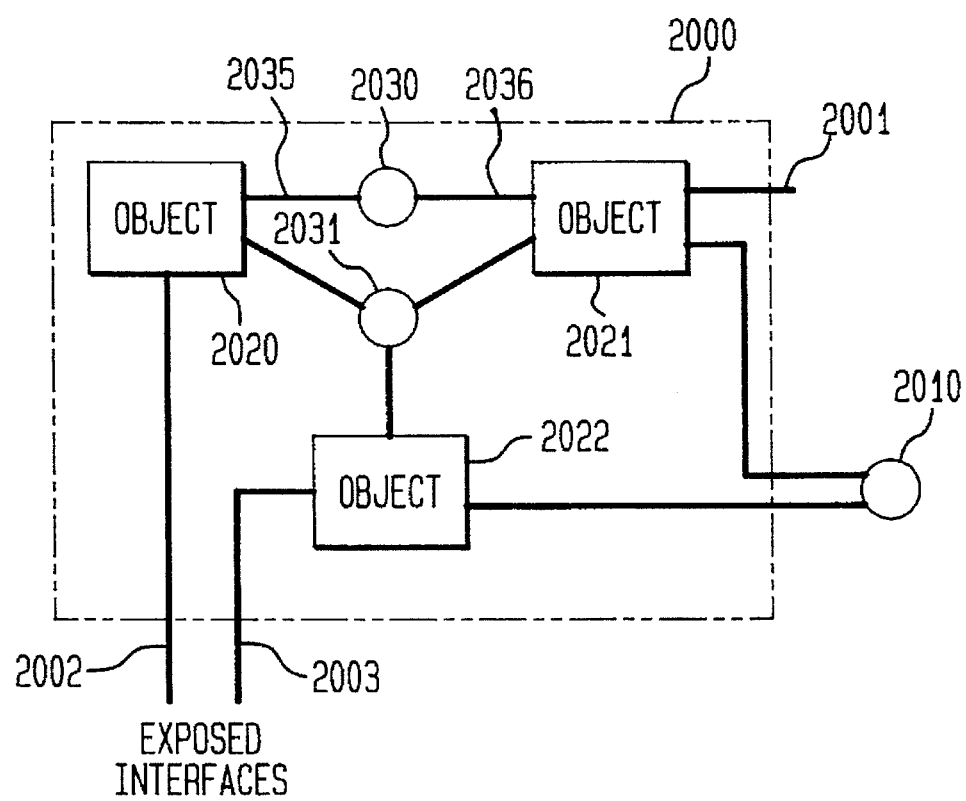
FIG. 20 illustrates a Composite Interface Description, with Atomic Interface Descriptions interconnected by Interfaced Cycles.

With reference to FIG. 20, the manner in which a Composite Interface Description for composite object 2000 tracks with the description of object 1900 of the Atomic Interface Description of FIG. 19 is illustrated. In particular, the Composite Interface Description also includes a list of Exposed Interface Cycles (such as cycle 2010) and a list of Exposed Interfaces (such as 2001–2003). Interface cycles 2030 and 2031 are internal and are not part of the list of Exposed Interface Cycles. Similarly, interfaces such as interfaces 2035 and 2036 are internal and are not listed on the Exposed Interface list.

Interface Cycle Objects have uniform interfaces. They are paired N-types and L-types. N-type interfaces are prefixed by N while L-type interfaces are prefixed by L. An N-type interface can only be connected to an L-type interface. Each interface is divided into two main components called In and Out. The In component cannot be locally modified. The Out component can be locally modified. The basic components of In and Out themselves are Phase and Data. The Data portion has some constraint on length and can be used to represent any data structure that fits into it. The Phase component has a value of the phase itself which can either be 0 or 1, and an Event component which is used to monitor exceptions. These interfaces are treated as local variables of the object. However, connections between connected In and Out interfaces of different objects are assumed to represent constraints between these variables as long as the objects use special functions to manipulate the components of the interfaces. Special functions are designed so that access to In is possible only if the equality of In and corresponding Out is true. This is accomplished by making all accesses to these interfaces through Atomic Attempt Cycles. In any interface, once the Phase changes, both In and Out become inaccessible until the Phase changes again. This subsequent Phase change signifies that the In has presently assumed the value of the Out it is connected to. At this time, both In and Out of the interface become accessible again. Therefore, at the beginning of each cycle, it can be assumed that the above equations in fact hold. The main difference between the N side and L side is that when an L side is first connected to an N side, it yields the starting phase to N. Once the connection is initialized, a pair of Atomic Attempt Cycle services can maintain it. These functions use their own variables to store the state of the interface and control access to it by programs within the object.

Services:
    try (out, result)=copy__in(in) else <label>;
    try (in, result)=copy__out(out) else <label>;
    Usage:
    begin
    get: try (x, result)=copy__in(a.in) else get;
    process: set y=x+2;
    put: try (a.out, result)=copy__out(y) else put;
    get;
    end The Dynamic Interface Cycle Manager performs the functions of initializing each of the managers and objects, further it coordinates the activation or powering up of the objects. Objects which are just specifications become active and start responding to cycles. This is very analogous to hardware, where the definition of a system in terms of the interconnection of components is powered up by supplying each component with electrical power.

Interface Cycle Controller

Interface Cycle Controller is a facility for 1) the dynamic creation (instantiation and activation) of Objects from their Descriptions, and 2) for dynamic connection and disconnection of Object interfaces to other Object interfaces via Interface Cycles. When Interface cycle controller is passed a request to instantiate an object, it is given 1) an Object description, and 2) some location identifier which indicates the neighborhood (typically processor) where the new object should be instantiated. Upon successful instantiation of the new Object, Interface Cycle Controller returns a unique Object identifier to the requester. If Interface cycle controller is unable to successfully instantiate the new Object, it notifies the requester of this condition.

When Interface cycle controller is passed a request to set up a connection, it is passed 1) an Object identifier, 2) an interface name, and 3) an Interface Cycle identifier. If the Interface Cycle identifier is NULL, or if the Interface Cycle named by the Interface Cycle identifier does not already exist, Interface cycle controller creates a new Interface Cycle Manager either with the supplied Interface Cycle Identifier, or with a new Interface Cycle Identifier (if the request contained a NULL Interface Cycle Identifier), and returns the Interface Cycle Identifier if successful, or FAIL if the request could not be satisfied.

In order to instantiate a new Object, Interface cycle controller must recursively instantiate any component Objects of a composite Object, and interconnect their interfaces using Interface Cycles. To do this, Interface cycle controller first creates an Interface Cycle Manager, and then uses information from the Object Description to connect the interfaces of the component Objects to the interfaces of the Interface Cycle Manager.

Configure Interconnection of Objects Using ICM's

Composite objects are built by interconnecting existing objects through SICMs. These interconnections specify the individual components, SICMs and their connections. DIM first scans the connection list and initializes SICMs with IPF, OPF programs. Each instance of an SICM is owned by a Protection Domain which is a set of specific policies implemented in IPF and OPF. Unless authorized by the owner, the initialization fails. This causes all the NSIC interfaces to be initialized determining the starting phase and the set of programs that interlock protection with distribution and synchronization. It then uses its own BCs or BMC to realize the prescribed connectivity.

Configure ICMs with Input and Output Protection Programs

When an Interface Cycle is created, ICC loads them with default Input and Output protection programs. However the creator of the object another object or a person can authorise the loading of special protection programs. This is possible, because the ICC checks the validity of the request using a form of digital signature verification. These programs can specific to cycles and can be installed in such a way that the privilages an object has may get altered after the lapse of a fixed number of cycles. In a dynamic system, when the Cycle Manager has a protection pod, much like the control pod of the Dynamic Multipoint Cycle, these protection programs may be altered without destroying the Cycle.

Each Interface Cycle could itself be created by specific programs that are the implementers of unique policies.

These, called Protectors here, determines an algorithm that checks the validity of data that is distributed through the Interface Cycle. The data is validated by algorithmically determining whether the data in fact satisfies the requirements of the Protector. These may depend on the cycle itself. Data that may satisfy the protection requirement in a certain cycle may not satisfy the requirement in another. Therefore, a duplicate of a data item sent by a valid Interface Object cannot be used by another in a way to corrupt the data of another. The algorithm for checks need not be installed by the protector, it can be a fixed algorithm like those used in public key signature systems[OM90]. We allow the installation of any algorithm into the Interface Cycle by a valid Protector as long as it is itself first authorised to connect to Interface Cycles. This same protection system can also implement abstractions defined by a family of applicable functions to each object. Therefore, a protector can be used to enforce certain type constraints across interfaces. Depending on the type of the Interface Objects that are connected, an Interface Cycle may have an algorithm to check type compatibility and check for the operations requested through from objects can be verified before adding to the Bag of data associated with the cycle. Some of the Objects can be blocked from adding to the bag when they should not by making this check a function of the count of the cycle. Therefore, the applicability of the function is checked at run-time namely when the object has already been activated.

Activate and Deactivate Composite Objects

The Interface Cycle Controller can also activate and deactivate objects. The activation of an object is done by acquiring system resources it needs such as CPU and memory and then loading and executing the code corresponding to composite objects after all the required Interface Cycle Managers needed for connecting them are themselves activated. In this activity, the Dynamic versions of Cycle Managers provide for splitting cycles in a controllable way so that activation of objects can be sequenced and synchronized. The same facility is used for deactivation of composite objects. For this, the IC's first activate connections by activating cycles at various levels of Dynamic Interface Cycles, then through these connections deactivate other connections at lower levels and then deactivate the objects themselves.

Interface Cycle Process

The Interface Cycle Process may be used in any stage of the system development process to model systems of objects or to implement them. We describe here the key steps involved. These are the creation and maintenance of a library of components much like libraries of hardware components that can be reused by interconnecting them with Interface Cycles that suit the application.

Create Library of Components of ICOs and ICMs

Objects specified using one of the many Interface Cycle interfaces are represented by their executable codes, in a data base. This data base has the representation of the components in terms of the exposed interfaces, Interface Cycle Managers and Connections. The library also contains information about the IP and OP programs that handle those Interfaces. These programs provide such functions as checking whether the type of data structures that are expected at the ports are in fact the ones presented by the Interface Cycle Managers. Because the library is based on the notion of composition using Interface Cycles, it is possible to derive a unique description of a composite object from the descriptions of the component objects. Were it not the case, reuse of the library would need extraneous information to disambiguate a composite description. This is a significant deterrent to rouse because such information is not usually representable in a universal format suitable for general data bases. Abstract connectivity, that we base the ICO library, on the other hand is the corner stone of modern databases that support hardware development.

Create a Manager for the Library

In order that such a library to be useful in large development environments, it has to be managed so that objects in development by different persons can still be connected and tested during the process of development. The manger's main functions are to provide convenient access to the library of existing components and those that are in process of development so that they can be safely connected for test or development purposes. A key to this is the implementation of a protection policy across the interfaces of objects. These policies are programs as described above which are changeable by the library manager depending on the reliability of the code being developed. As an object becomes more and more reliable, it can be restricted less and less and the neighboring objects in connections can be allowed to use more of its functions. The manager of the library implements such policies.

Create and Maintain the Environment Using ICC's

Once a library exists, the environment for using the library for simulation or implementation requires the activation and deactivation of composite objects in a controlled way. For this purpose we can use the Interface Cycle Controllers. These controllers synchronize the activation of different components so that a composite is activated in an orderly fashion. Because of the fact that all inter object connections are standardized through the Interface Cycles, the environment can be created without understanding the use of components. It is necessary to know which of the required connections have to be activated together and which have to be sequenced, This installer itself can be made into an Interface Cycle Object which by controlling the Dynamic Interface Cycles explained above gets a higher level of control of the connections than the composite object itself. It can use this control to sequence in safe way the connections. Such sequencing together with resources to execute the script of objects provides sufficient functions to compose objects and then "hot plug" them into an existing interconnection of objects. Once again because of the canonical model for composing based on Intercycle Managers.

Illustrative Embodiments

Sample flow—Iterative Matrix multiplication

This section presents a simple example of four Objects collaborating over a single Interface Cycle to calculate and print a simple iterative matrix multiplication, as follows:

$$\text{given vector} \begin{bmatrix} x_{1_n} \\ x_{2_n} \\ x_{3_n} \end{bmatrix} \text{ and matrix } \begin{bmatrix} 1 & 2 & 3 \\ 4 & 5 & 6 \\ 7 & 8 & 9 \end{bmatrix}$$

$$\text{find vector} \begin{bmatrix} x_{1_{n+1}} \\ x_{2_{n+1}} \\ x_{3_{n+1}} \end{bmatrix} \text{ where}$$

$$x_{1_{n+1}} = 1 * x_{1_n} + 2 * x_{2_n} + 3 * x_{3_n}$$
$$x_{2_{n+1}} = 4 * x_{1_n} + 5 * x_{2_n} + 7 * x_{3_n}$$
$$x_{3_{n+1}} = 7 * x_{1_n} + 8 * x_{2_n} + 9 * x_{3_n}$$

Figure 21:
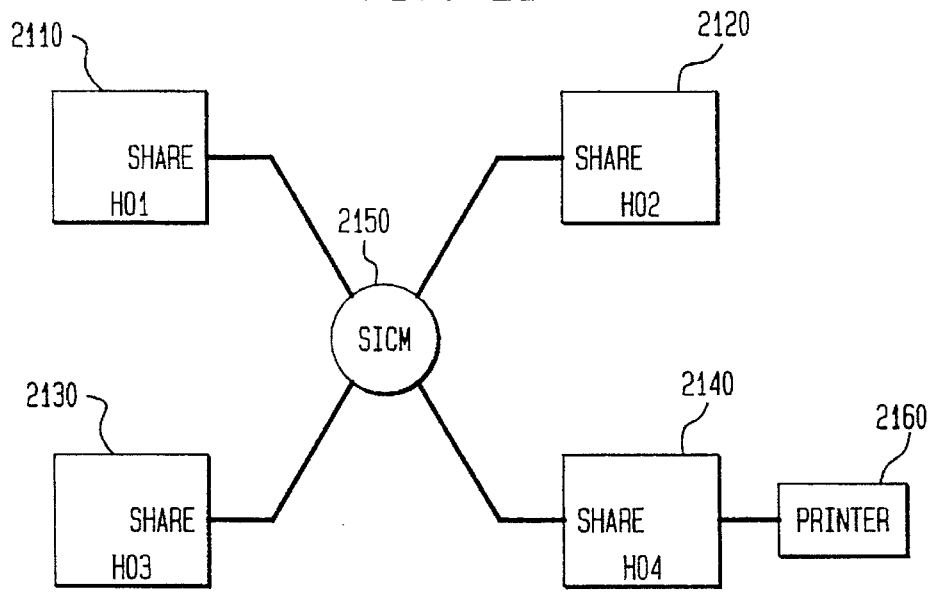
FIG. 21 illustrates four Objects and one Static Interface cycle Manager collaborating to perform and print a matrix multiplication example.

The system consists of four Objects shown in FIG. 21, each with one interface coupled to SICM 2150. HO$_1$, 2110

$HO_2$ 2120, and $HO_3$ 2130 are used to calculate $x_{1_{n+1}}, x_{2_{n+1}}$, and $x_{3_{n+1}}$, respectively $HO_4$ 2140 is used to print the results via printer 2160.

Interface description for $HO_1$:

Exposed LBMC: SHARE

Script:

```
begin
    x1=4;
    X2=2;
    X3=7;
    process: set x1=1*x1+2*x2+3*x3;
    put: try (SHARE, result)=copy_out(X1) else put;
    next: try (result)=change_phase(SHARE) else next;
    get: try (Bag, result)=copy_in(SHARE) else get;
    set (x1, x2, x3)=parse (Bag);
    goto process;
end
```

Interface description for $HO_2$:

Exposed LBMC: SHARE

Script:

```
begin
    x1=4;
    x2=2;
    x3=7;
    process: set x2=4*x1+5*x2+6*x3;
    put: try (SHARE, result)=copy_out(x2) else put;
    next: try (result)=change_phase(SHARE) else next;
    get: try (Bag, result)=copy_in(SHARE) else get;
    set (x1, x2, x3)=parse(Bag);
    process;
end
```

Interface description for $HO_3$:

Exposed LBMC: SHARE

Script:

```
begin;
    x1=4;
    x2=2;
    x3=7;
    process: set x2=7*x1+8*x2+9*x3;
    put: try (SHARE, result)=copy_out(x3) else put;
    next: try (result)=change_phase(SHARE) else next;
    get: try (Bag, result)=copy_in(SHARE) else get;
    set (x1, x2, x3)=parse(Bag);
    goto process;
end
```

Interface description for $HO_4$:

Exposed LBMC: SHARE

Script:

```
begin
    x1=4;
    x2=2;
    x3=7;
    process: print x1,x2,x3;
    next: next: try (result)=change_phase(SHARE) else next;
    get: try (Bag, result)=copy_in(SHARE) else get;
    set (x1, x2, x3)=parse(Bag);
    process;
```

If the group of Objects that implement matrix multiplication in the example above received data that was not in the format desired, then multiplication operation could result in an error. Where groups of objects have to operate together on any common object such problems arise. Using Interface Cycles the Protector could load the cycle with a Input Protection Program that checks that the input conforms to the correct format for numeric data. The Output Protection Program could check the number of elements in the bag and the properties of the whole bag before distributing them to the Ports. Furthermore, if the required formats vary with the pods the input protection program could insert codes into the element of the bag it contributes which allows the output protection program to selectively transform the formats.

Composition

Figure 22:
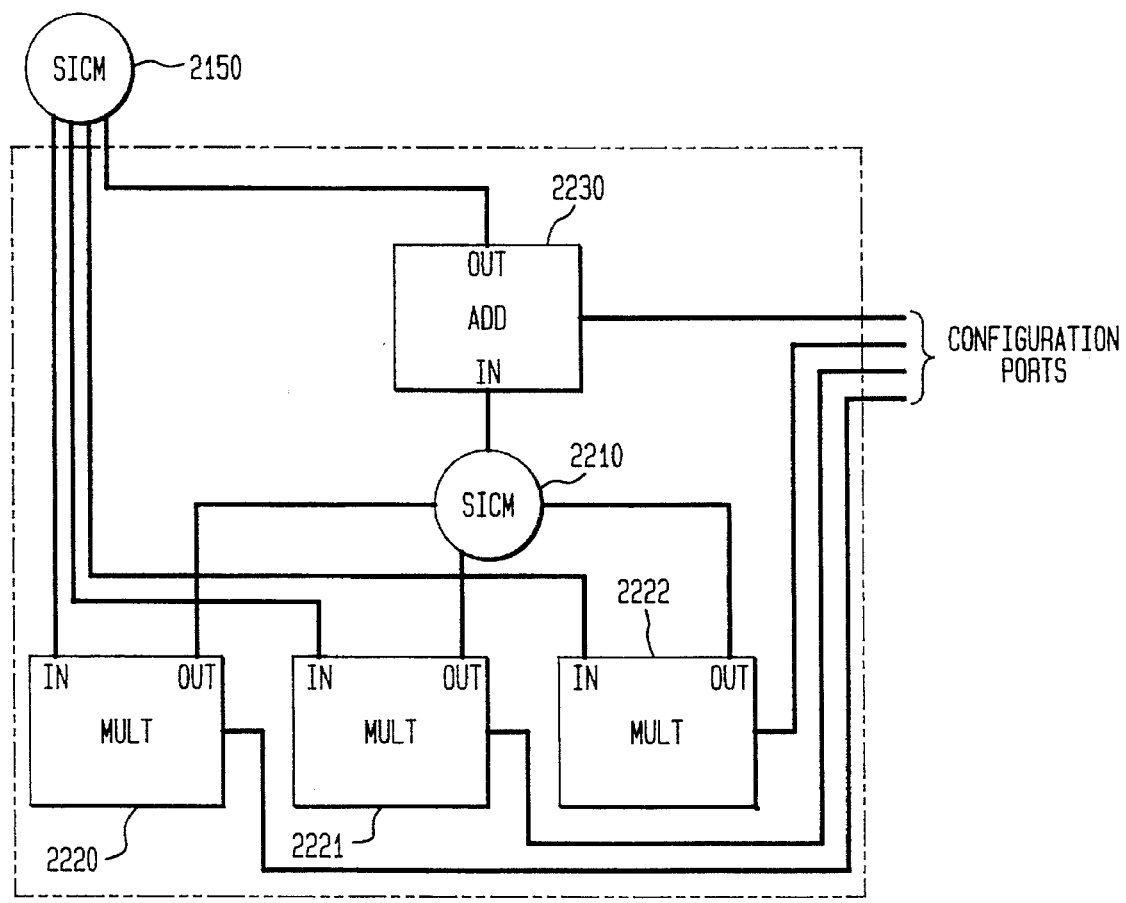
FIG. 22 illustrates a composite Object which performs part of the above matrix multiplication.

The following example shows a solution of the same matrix multiplication problem using smaller adder and multiplier Objects composed into larger Objects to implement the behavior of $HO_1$, $HO_2$, and $HO_3$ above. Each of these will look. as follows:

The composite Object consists of three multiplier Objects 2220, 2221, and 2222 and one adder Object 2230, and two exposed Interface Cycles. interconnected as shown in FIG. 22. SICM 2250 is used for distribution of data among the objects as in the previous example. Atomic Interface descriptions for the adder and multiplier Objects are provided below.

The entire matrix multiplication system consists of three of these composite objects, one printer object as in the previous example, and one configuration object with 12 ports which initializes each adder and multiplier object. SICM 2250 is shared by all three composite Objects and the printer object.

Interface object: Multiplier:

Exposed Interface Cycles: none

Exposed ports: IN, OUT, CONFIGURE;

```
Script:
begin
start:
    if read(CONFIGURE not INVALID) then
        parse(read(CONFIGURE) into index and mult;
    else
        go to start
    end if
    loop:
    if read(IN not INVALID) then
        parse read(IN)into X[];
        write (mult * x[index]) to OUT;
    end if
    go to loop;
end
```

Interface obioct: Adder:

Exposed Interface Cycles: none

Exposed ports: IN, OUT, CONFIGURE;

```
Script:
begin
start:
    if read(CONFIGURE not INVALID) then
        read(CONFIGURE) into index;
    else
        go to start
    end if
    loop:
    if read(IN not INVALID) then
        parse read(IN)into X[];
        write (index,x[1]+x[2]+x[3]) to OUT;
    end if
    go to loop;
end
```

Dynamic Examples

Extensions to Basic Subject Matter

List of Applications

Distributed data bases

Use Interface Cycles to implement distributed data bases without centralized locking protocols. Use mediation programs which split the database update cycle using DICs, to detect and resolve collisions immediately after they occur, but before they reach the database.

Protocol synthesis

Non intrusive debugging of distributed systems

Use privileged Dynamic Interface Cycles to "snoop" on the Interface Cycles of other programs. Observe the interaction between objects without having to add debug information to their source code. Single step through distributed systems.

Fault Tolerant Servers

Use an Object which splits client requests and passes them to redundant servers operating in parallel using Interface Cycles, passes a single response back to the client, hides the failure of a server from the client. Use Dynamic Interface Cycles between servers to maintain synchronization or restore it in the event of failure, transparent to clients.

From an Object description, automatically generate an interconnected set of Objects, distributed across multiple processors to create a fault tolerant server. Use interface information from the description to generate the protocol for recovery after failure.

Schematic capture

Use a graphical tool, possibly an existing Computer Aided Design (CAD) schematic capture system modified to recognize Interface Cycles instead of real-time, to specify and simulate systems. Users can select components from a library, modify and interconnect them using a graphical interface, and then directly execute the graphical specification.

Dynamic Configuration

Use Dynamic Interface Cycles to reconfigure connections between objects while the entire system is active. Use DICs to update software while the system is active.

It is to be understood that the above-described embodiments are simply illustrative of the application of the principles in accordance with the present invention. Other embodiments may be readily devised by those skilled in the art which may embody the principles in spirit and scope. Thus, it is to be further understood that the methodology described herein is not limited to the specific forms shown by way of illustration, but may assume other embodiments limited only by the scope of the appended claims.

References

[BL88] Black, U. 1988, *Physical Layer Interfaces and Protocols*, Washington, D.C., Computer Society Press.

[LSU91] Lipsett, R., Schaefer, C., and Ussery, C. 1991, *VHDL: Hardware Description and Design*, Boston, Mass., Kluwer Academic Publishers.

[NA93] Navabi, Z. 1993, *VHDL—Analysis and Modeling of Digital Systems*, New York, N.Y., McGraw Hill, Inc.

[OM90] Omura, J. K. 1990, *Novel Applications of Cryptography in Digital Communications*, IEEE Communications Magazine, Vol.28, No. 5, May 1990.

[PE91] Perry, D. 1991, *VHDL*, New York, N.Y., McGraw Hill, Inc.

[TAN89] Tannenbaum, A. S. 1989, *Computer Networks*. (2nd Ed.), Englewood Cliffs, N.J.: Prentice-Hall.

| Table of Contents | |
|---|---|
| Field of the Invention | 1 |
| Copyright Notice | 1 |
| Background of the Invention | 1 |
| VHDL | 5 |
|    Descriptive Capability | 5 |
|    Large Scale Design and Reuse | 5 |
|    Design Methodology and Technology Support | 5 |
|    Technology and Process Independence | 5 |
|    Design Exchange | 6 |
|    Public Availability | 6 |
|    Government Support | 6 |
| Summary of the Invention | 6 |
| Brief Description of the Drawing | 10 |
| Detailed Description | 11 |
| Overview | 12 |
|    Protection | 13 |
|    Distribution | 13 |
|    Coordination | 14 |
|    Interlock of Protection, Coordination and Distribution | 15 |
| Details | 16 |
|    Working Notation | 16 |
|       Data Structures | 16 |
|       Pseudo Code | 18 |
|    Objects, Descriptions and Composition | 19 |
|       Atomic Objects and Descriptions | 19 |
|       Composite Objects and Descriptions | 24 |
|    Interface Cycle Process Elements | 28 |
|       Atomic Transfer Cycle | 28 |
|       Atomic Attempt Cycle | 29 |
|       Atomic Interrupt Cycle | 30 |
|       Basic Directional Transfer | 30 |
|       Basic Cycle | 34 |
|       Basic Multi-point Cycle (BMC) | 37 |
|       Dynamic Multi-point Cycle (DMC) | 46 |
|       Static Interface Cycle | 59 |
|       Dynamic Interface Cycle (DIC) | 65 |
|       Extended Cycle | 66 |
|    Interface Cycle Objet Desription and Composition | 66 |
|    Interface Cycle Controller | 69 |
|    Interface Cycle Process | 72 |
|       Create Library of Components of ICOs and ICMs | 72 |
|       Create a Manager for the Library | 72 |
|       Configure and Maintain the Environment Using ICCs | 73 |
| Illustrative Embodiments | 74 |
|    Composition | 77 |
|    Dynamic Examples | 79 |
| Extensions to Basic Suject Matter | 79 |
|    List of Applications | 79 |
|       Distributed data bases | 79 |
|       Protocol synthesis | 79 |
|       Non intrusive debugging of distributed systems | 79 |
|       Fault Tolerant Servers | 79 |
|       Schematic capture | 80 |
|       Dynamic Configuration | 80 |
| References | 81 |
| Table of Contents | 82 |
| Claims | 85 |
| Abstract | 99 |

What is claimed is:

1. A method for the operation of a computer-based system composed of two distributed objects each having an interface, the objects being programs, hardware, or canonical representations of such programs or hardware, the method comprising the steps of interconnecting each interface, and coordinating the connected interfaces in self-synchronized cycles through the interfaces by advancing to the next cycle from the present cycle only upon mutual agreement by the objects to thereby engender the self-synchronization between the objects.

2. The method as recited in claim 1 further including the steps of distributing persistent data to each interface in each of the cycles, and interlocking, in each of the cycles, the steps of coordinating and distributing to ensure that the steps of coordinating and distributing are completed before the objects agree to advance to the next cycle from the present cycle so as to thereby ensure that the objects access the persistent data in each corresponding one of the cycles.

3. The method as recited in claim 2 further including the step of protecting the persistent data in each of the cycles, and wherein the step of interlocking further includes the step of interlocking, in each of the cycles, the step of protecting with the steps of coordinating and distributing to ensure that the steps of coordinating, distributing, and protecting are completed before the objects agree to advance to the next cycle so as to thereby ensure that the objects access the protected, persistent data in each corresponding one of the cycles.

4. A method for the operation of a computer-based system composed of a plurality of distributed objects each having an interface, the objects being programs, hardware, or canonical representations of such programs or hardware, the method comprising the steps of interconnecting each interface, and coordinating the connected interfaces in self-synchronized cycles through the interfaces by advancing to the next cycle from the present cycle only upon mutual agreement by the objects to thereby engender the self-synchronization among the objects.

5. The method as recited in claim 4 further including the steps of distributing persistent data to each interface in each of the cycles, and interlocking, in each of the cycles, the steps of coordinating and distributing to ensure that the steps of coordinating and distributing are completed before the objects agree to advance to the next cycle from the present cycle so as to thereby ensure that the objects access the persistent data in each corresponding one of the cycles.

6. The method as recited in claim 5 further including the step of protecting the persistent data in each of the cycles, and wherein the step of interlocking further includes the step of interlocking, in each of the cycles, the step of protecting with the steps of coordinating and distributing to ensure that the steps of coordinating, distributing, and protecting are completed before the objects agree to advance to the next cycle from the present cycle so as to thereby ensure that the objects access the protected, persistent data in each corresponding one of the cycles.

7. A method for the operation of a computer-based system composed of two distributed objects each having an interface, the objects being programs, hardware, or canonical representations of such programs or hardware, the method comprising the steps of interconnecting each interface, coordinating the connected interfaces in self-synchronized cycles through the interfaces by advancing to the next cycle from the present cycle only upon mutual agreement by the objects to thereby engender the self-synchronization between the objects, distributing persistent data to each interface in each of the cycles, and interlocking, in each of the cycles, the steps of coordinating and distributing to ensure that the steps of coordination and distributing are completed before the objects agree to advance to the next cycle from the present cycle so as to thereby ensure that the objects access the persistent data in each corresponding one of the cycles.

8. The method as recited in claim 7 further including the step of protecting the persistent data in each of the cycles, and wherein the step of interlocking further includes the step of interlocking, in each of the cycles, the step of protecting with the steps of coordinating and distributing to ensure that the steps of coordinating, distributing, and protecting are completed before the objects agree to advance to the next cycle from the present cycle so as to thereby ensure that the objects access the protected, persistent data in each corresponding one of the cycles.

9. A method for the operation of a computer-based system composed of a plurality of distributed objects each having an interface, the objects being programs, hardware, or canonical representations of such programs or hardware, the method comprising the steps of interconnecting each interface, coordinating the connected interfaces in self-synchronized cycles through the interfaces by advancing to the next cycle from the present cycle only upon mutual agreement by the objects to thereby engender the self-synchronization among the objects, distributing persistent data to each interface in each of the cycles, and interlocking, in each of the cycles, the steps of coordinating and distributing to ensure that the steps of coordinating and distributing are completed before the objects agree to advance to the next cycle from the present cycle so as to thereby ensure that the objects access the persistent data in each corresponding one of the cycles.

10. The method as recited in claim 9 further including the step of protecting the persistent data in each of the cycles, and wherein the step of interlocking further includes the step of interlocking, in each of the cycles, the step of protecting with the steps of coordinating and distributing to ensure that the steps of coordinating, distributing, and protecting are completed before the objects agree to advance to the next cycle so as to thereby ensure that the objects access the protected, persistent data in each corresponding one of the cycles.

11. A method for the operation of a computer-based system composed of two distributed objects each having an interface, the objects being programs, hardware, or canonical representations of such programs or hardware, the method comprising the steps of interconnecting each interface, coordinating the connected interfaces in self-synchronized cycles through the interfaces by advancing to the next cycle from the present cycle only upon mutual agreement by the objects to thereby engender the self-synchronization between the objects, distributing persistent data to each interface in each of the cycles, protecting the persistent data in each of the cycles, and interlocking, in each of the cycles, the steps of coordinating, distributing, and protecting to ensure that the steps of coordinating, distributing, and protecting are completed before the objects agree to advance to the next cycle from the present cycle so as to thereby ensure that the objects access the protected, persistent data in each corresponding one of the cycles.

12. A method for the operation of a computer-based system composed of a plurality of distributed objects each having an interface, the objects being programs, hardware, or canonical representations of such programs or hardware, the method comprising the steps of interconnecting each interface, coordinating the connected interfaces in self-synchronized cycles through the interfaces by advancing to the next cycle from the present cycle only upon mutual agreement by the objects to thereby engender the self-synchronization among the objects, distributing persistent data to each interface in each of the cycles, protecting the persistent data in each of the cycles, and interlocking, in each of the cycles, the steps of coordinating, distributing, and protecting to ensure that the steps of coordinating, distributing, and protecting are completed before the objects agree to advance to the next cycle from the present cycle so as to thereby ensure that the objects access the persistent data in each corresponding one of the cycles.

13. A method for the operation of a computer-based system composed of distributed objects each having at least one interface, the objects being programs, hardware, or canonical abstractions of such programs or hardware, the method comprising the steps of designating one of the objects as an interface cycle manager and connecting a single interface of each of the other objects to a corresponding interface of the interface cycle manager, and coordinating all interfaces in self-synchronized cycles through the connections under control of the interface cycle manager by advancing to the next cycle from the present cycle only upon mutual agreement by the objects to thereby engender the self-synchronization among the objects.

14. The method as recited in claim 13 further including the steps of distributing persistent data from the interface cycle manager to each interface of the other objects in each of the cycles, and interlocking, in each of the cycles, the steps of coordinating and distributing to ensure that the objects access the persistent data in corresponding ones of the cycles.

15. The method as recited in claim 14 further including the step of protecting the persistent data in each of the cycles, and wherein the step of interlocking further includes the step of interlocking, in each of the cycles, the step of protecting with the steps of coordinating and distributing to ensure that the objects access the protected, persistent data in corresponding ones of the cycles.

16. The method as recited in claim 15 wherein the interface of each of the other objects is arranged to send object data generated by each of the other objects to the interface cycle manager through the corresponding ones of the connections, the method further comprising the step of accumulating during each of the cycles any object data sent by the other objects in the interface cycle manager to form the persistent data.

17. The method as recited in claim 16 wherein the step of protecting includes the steps of checking for errors in any object data upon input to the interface cycle manager and checking for errors in the persistent data during the step of accumulating.

18. A method for the operation of a computer-based system composed of distributed objects each having at least one interface, the objects being programs, hardware, or canonical abstractions of such programs or hardware, the method comprising the steps of designating one of the objects as an interface cycle manager and connecting a single interface of each of the other objects to a corresponding interface of the interface cycle manager, coordinating all interfaces in self-synchronized cycles through each connection of objects by advancing to the next cycle from the present cycle only upon mutual agreement by the objects, distributing persistent data to the interfaces in each of the cycles, and interlocking, in each of the cycles, the steps of coordinating and distributing to generate self-synchronization among the objects.

19. The method as recited in claim 18 further including the step of protecting the persistent data in each of the cycles, and wherein the step of interlocking further includes the step of interlocking, in each of the cycles, the step of protecting with the steps of coordinating and distributing to ensure that the objects access the protected, persistent data in corresponding ones of the cycles.

20. The method as recited in claim 19 wherein each of the other objects is arranged to send object data generated by each of the other objects to the interface cycle manager through the corresponding one of the connections, the method further comprising the step of accumulating during each of the cycles any object data sent by the other objects in the interface cycle manager as the persistent data.

21. The method as recited in claim 19 wherein the interface of each of the other objects is arranged to send object data generated by each of the other objects to the interface cycle manager through the corresponding ones of the connections, the method further comprising the step of accumulating during each of the cycles any object data sent by the other objects in the interface cycle manager to form the persistent data.

22. The method as recited in claim 21 wherein the step of protecting includes the steps of checking for errors in any object data upon input to the interface cycle manager and checking for errors in the persistent data during the step of accumulating.

23. The method as recited in claim 19 wherein the step of interlocking includes the step of controlling each of the other objects by operations of the interface cycle manager.

24. The method as recited in claim 23 wherein each interface is a data structure, wherein the interface cycle manager is arranged with one manager data structure for each of the other objects, and each of the other objects is arranged with an object data structure for sending any object data generated by said object to the interface cycle manager and for receiving the persistent data, the object data structure being accessible to operations executing within each corresponding object under control of the interface cycle manager, and wherein the step of controlling comprises the steps of modifying the manager data structure entries by the interface cycle manager, and distributing the modified entries to each of the other objects.

25. The method as recited in claim 24 wherein each interface is a data structure, wherein the interface cycle manager is arranged with one manager data structure for each of the other objects, and each of the other objects is arranged with an object data structure for sending any object data generated by said object to the interface cycle manager and for receiving the persistent data, the object data structure being accessible to operations executing within each corresponding object under control of the interface cycle manager, and wherein the step of controlling comprises the steps of storing any data sent by each of the other objects in the manager data structure, forming the persistent data from data stored in the manager data structure, changing a phase manager data structure entry by the interface cycle manager to produce a phase change indicative of the start of the next cycle upon the formation of the persistent data, distributing the phase change to the object data structure of each other object along with the persistent data, and detecting the phase change by each of the other objects to enable each of the other objects to access the persistent data distributed by the interface cycle manager.

26. A method for the operation of a computer-based system composed of distributed objects each having at least one interface, the objects being programs, hardware, or canonical abstractions of such programs or hardware, the method comprising the steps of designating one of the objects as an interface cycle manager and connection a single interface of each of the other objects to a corresponding interface of the interface cycle manager, coordinating the interfaces in self-synchronized cycles through each connection by advancing to the next cycle from the present cycle only upon mutual agreement by the objects to thereby engender the self-synchronization among the it objects, distributing persistent data to the interfaces in each of the cycles, protecting the persistent data in each of the cycles, and interlocking, in each of the cycles, the steps of coordinating, distributing, and protecting to ensure that the objects access the protected, persistent data in corresponding ones of the cycles.

27. The method as recited in claim 26 wherein the interface of each of the other objects is arranged to send object data generated by each of the other objects to the interface cycle manager through the corresponding ones of the connections, the method further comprising the step of accumulating during each of the cycles any object data sent by the other objects in the interface cycle manager to form the persistent data.

28. The method as recited in claim 27 wherein the step of protecting includes the steps of checking for errors in any object data upon input to the interface cycle manager and checking for errors in the persistent data during the step of accumulating.

29. The method as recited in claim 26 wherein the step of interlocking includes the step of controlling each of the other objects with the interface cycle manager.

30. The method as recited in claim 29 wherein each interface is a data structure, wherein the interface cycle manager is arranged with one manager data structure for each of the other objects, and each of the other objects is arranged with an object data structure for sending any object data generated by said object to the interface cycle manager and for receiving the persistent data, the object data structure being accessible to operations executing within each corresponding object under control of the interface cycle manager, and wherein the step of controlling comprises the steps of modifying the manager data structure entries by the interface cycle manager, and distributing the modified entries to each of the other objects.

31. The method as recited in claim 29 wherein each interface is a data structure, wherein the interface cycle manager is arranged with one manager data structure for each of the other objects, and each of the other objects is arranged with an object data structure for sending any object data generated by said object to the interface cycle manager and for receiving the persistent data, the object data structure being accessible to operations executing within each corresponding object under control of the interface cycle manager, and wherein the step of controlling comprises the steps of storing any data sent by each of the other objects in the manager data structure, forming the persistent data from data stored in the manager data structure, changing a phase manager data structure entry by the interface cycle manager to produce a phase change indicative of the start of the next cycle upon the formation of the persistent data, distributing the phase change to the object data structure of each other object along with the persistent data, and detecting the phase change by each of the other objects to enable each of the other objects to access the persistent data distributed by the interface cycle manager.

32. A method for the operation of a computer-based system composed of distributed objects each having at least one input data structure and at least one output data structure, the objects being programs, hardware, or canonical abstractions of such programs or hardware, the method comprising the steps of selecting one of the objects as an interface cycle manager and configuring the interface cycle manager with one input data structure and one output data structure for each of the other objects, and respectively connection the input data structure and the output data structure of each of the other objects to the corresponding output data structure and the corresponding input data structure of the interface cycle manager, coordinating both the input data structures and the output data structures in self-synchronized cycles through each connection between the interface cycle manager and the corresponding ones of the other objects by advancing to the next cycle from the present cycle only upon mutual agreement by the objects, distributing persistent data from the output data structure of the interface cycle manager to the input data structure of all the other objects in each of the cycles, and interlocking, in each of the cycles, the steps of coordinating and distributing to generate self-synchronization among the objects.

33. The method as recited in claim 32 wherein the output data structure of each of the other objects is arranged to send object data generated by each of the other objects to the interface cycle manager through the corresponding ones of the connections, the method further comprising the step of accumulating during each of the cycles any object data sent by the other objects in the interface cycle manager to form the persistent data.

34. The method as recited in claim 32 further including the step of protecting the persistent data in each of the cycles, and wherein the step of interlocking further includes the step of interlocking, in each of the cycles, the step of protecting with the steps of coordinating and distributing to ensure that the objects access the persistent data in corresponding ones of the cycles.

35. The method as recited in claim 34 wherein the input data structure of each of the other objects receives its input from the corresponding output data structure of the interface cycle manager, and wherein the corresponding input data structure of the interface cycle manager receives its input from the output data structure of the corresponding one of the other objects, and further wherein each input data structure has an input phase entry and each output data structure has an output phase entry such that the input phase entry in each of the other objects is modified by the interface cycle manager and such that the corresponding input phase entry of the interface cycle manager is modified by the corresponding one of the other objects, said step of accumulating being initiated whenever at least one input phase entry does not equal the corresponding output phase entry in the data structures of the interface cycle manager.

36. The method as recited in claim 34 wherein each of the other objects is arranged to send object data generated by each of the other objects to the interface cycle manager through the corresponding ones of the connections, the method further comprising the step of accumulating in each of the cycles any object data sent by the other objects in the interface cycle manager to form the persistent data.

37. The method as recited in claim 36 wherein the step of protecting includes the steps of checking for errors in any object data upon input to the interface cycle manager and checking for errors in the persistent data during the step of accumulating.

* * * * *